United States Patent
Evans

(10) Patent No.: US 7,174,490 B2
(45) Date of Patent: Feb. 6, 2007

(54) TEST SYSTEM RIDER UTILIZED FOR AUTOMATED AT-SPEED TESTING OF HIGH SERIAL PIN COUNT MULTIPLE GIGABIT PER SECOND DEVICES

(75) Inventor: Andrew C Evans, Aliso Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 391 days.

(21) Appl. No.: 10/206,943

(22) Filed: Jul. 30, 2002

(65) Prior Publication Data

US 2003/0196151 A1    Oct. 16, 2003

Related U.S. Application Data

(60) Provisional application No. 60/371,673, filed on Apr. 12, 2002.

(51) Int. Cl.
*G01R 31/28* (2006.01)
*G01R 31/02* (2006.01)
*G01R 31/00* (2006.01)

(52) U.S. Cl. .................. 714/724; 324/754; 324/755; 324/765

(58) Field of Classification Search ............ 324/73.1, 324/158.1, 754–757, 761; 365/200, 201; 714/27, 724, 736, 740, 742, 744; 702/110, 702/122, 125; 370/400, 442
See application file for complete search history.

(56) References Cited

U.S. PATENT DOCUMENTS 3,423,677 A * 1/1969 Hamilton et al. .......... 324/73.1
5,025,205 A * 6/1991 Mydill et al. .............. 324/73.1
5,103,169 A   4/1992 Heaton et al.
5,226,048 A   7/1993 Bandali et al.
5,506,510 A * 4/1996 Blumenau .................. 324/754
5,581,177 A  12/1996 Hussey et al.
5,736,850 A * 4/1998 Legal ...................... 324/158.1
5,764,069 A   6/1998 Cugini
5,900,753 A   5/1999 Cote et al.
6,157,185 A  12/2000 Stone et al.
6,275,962 B1 * 8/2001 Fuller et al. .............. 714/724

(Continued)

OTHER PUBLICATIONS

Keezer, D.C. et al, "Terabit-per-second Automated Digital Testing," ITC International Test Conference, IEEE, pp. 1 143-1 151 (2001).*
Keezer, D.C., "Multiplexing Test System Channels for Data Rates Above 1 Gb/s," International Test Conference, IEEE, pp. 362-368 (1990).*

(Continued)

*Primary Examiner*—Albert Decady
*Assistant Examiner*—John J. Tabone, Jr.
(74) *Attorney, Agent, or Firm*—Sterne, Kessler, Goldstein & Fox P.L.L.C.

(57) ABSTRACT

A testing system performs simultaneous automated at-speed testing of a plurality of devices that generate serial data signals having gigabit per second baud rates coupled to a DIB and device connectors on the DIB. The testing system includes a rider board including rider board connectors coupled to corresponding ones of the device connectors, an individual set of multiplexers coupled to each one of said rider board connectors, a controller coupled to each of said set of multiplexers, and an internal testing system including a tester and testing system multiplexers, said tester being coupled to each of said set of multiplexers via said testing system multiplexers.

15 Claims, 24 Drawing Sheets

U.S. PATENT DOCUMENTS

| | | | |
|---|---|---|---|
| 6,433,574 B1* | 8/2002 | Doherty et al. | 324/765 |
| 6,519,230 B1 | 2/2003 | Murayama | |
| 6,538,420 B2 | 3/2003 | Bald et al. | |
| 6,539,027 B1* | 3/2003 | Cambron | 370/442 |
| 6,631,340 B2 | 10/2003 | Sugamori et al. | |
| 6,691,269 B2* | 2/2004 | Sunter | 714/727 |
| 6,853,211 B2* | 2/2005 | Doherty et al. | 324/765 |
| 6,996,757 B2 | 2/2006 | Evans | |
| 2002/0099513 A1* | 7/2002 | Keezer | 702/125 |
| 2002/0105350 A1* | 8/2002 | Babcock | 324/765 |
| 2003/0193897 A1 | 10/2003 | Evans | |
| 2003/0196139 A1 | 10/2003 | Evans | |
| 2003/0196153 A1 | 10/2003 | Evans | |
| 2003/0208713 A1 | 11/2003 | Evans | |

OTHER PUBLICATIONS

International Search Report for Appln. No. PCT/US03/11116, issued Sep. 10, 2003, 6 pages.

Search Report from European Patent Application No. 03008272.1, 4 pages (dated Feb. 23, 2004).

Keezer, D.C. et al., "Terabit-per-second Automated Digital Testing," *ITC International Test Conference*, IEEE, pp. 1143-1151 (2001).

Keezer, D.C., "Multiplexing Test System Channels for Data Rates Above 1 Gb/s," *International Test Conference*, IEEE, pp. 362-368 (1990).

* cited by examiner

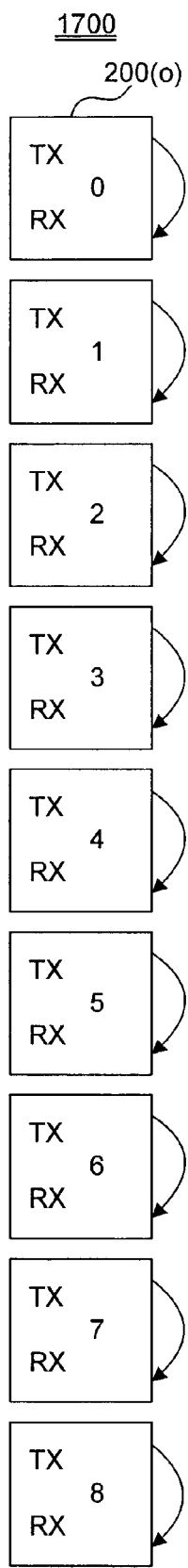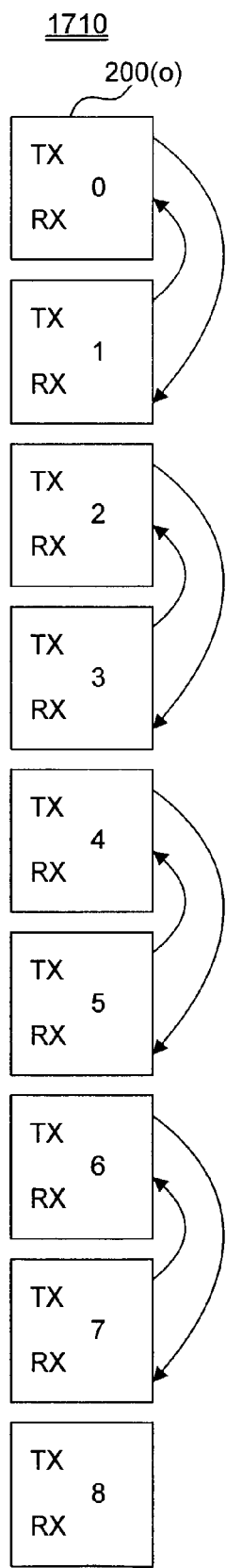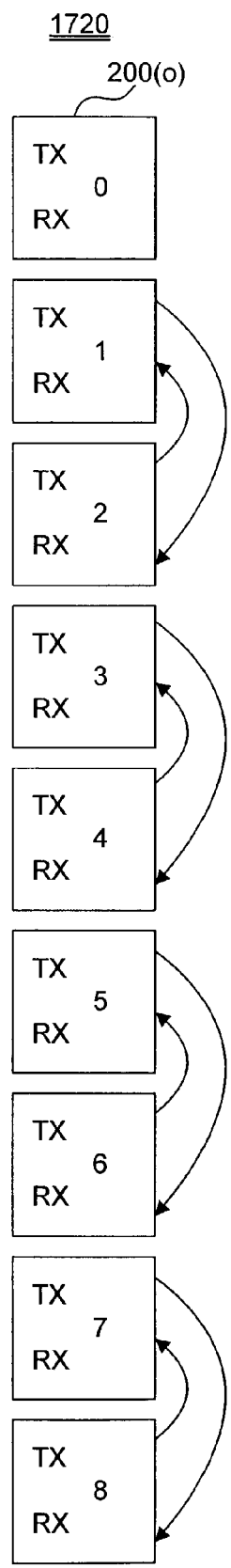
FIG. 17A  FIG. 17B  FIG. 17C

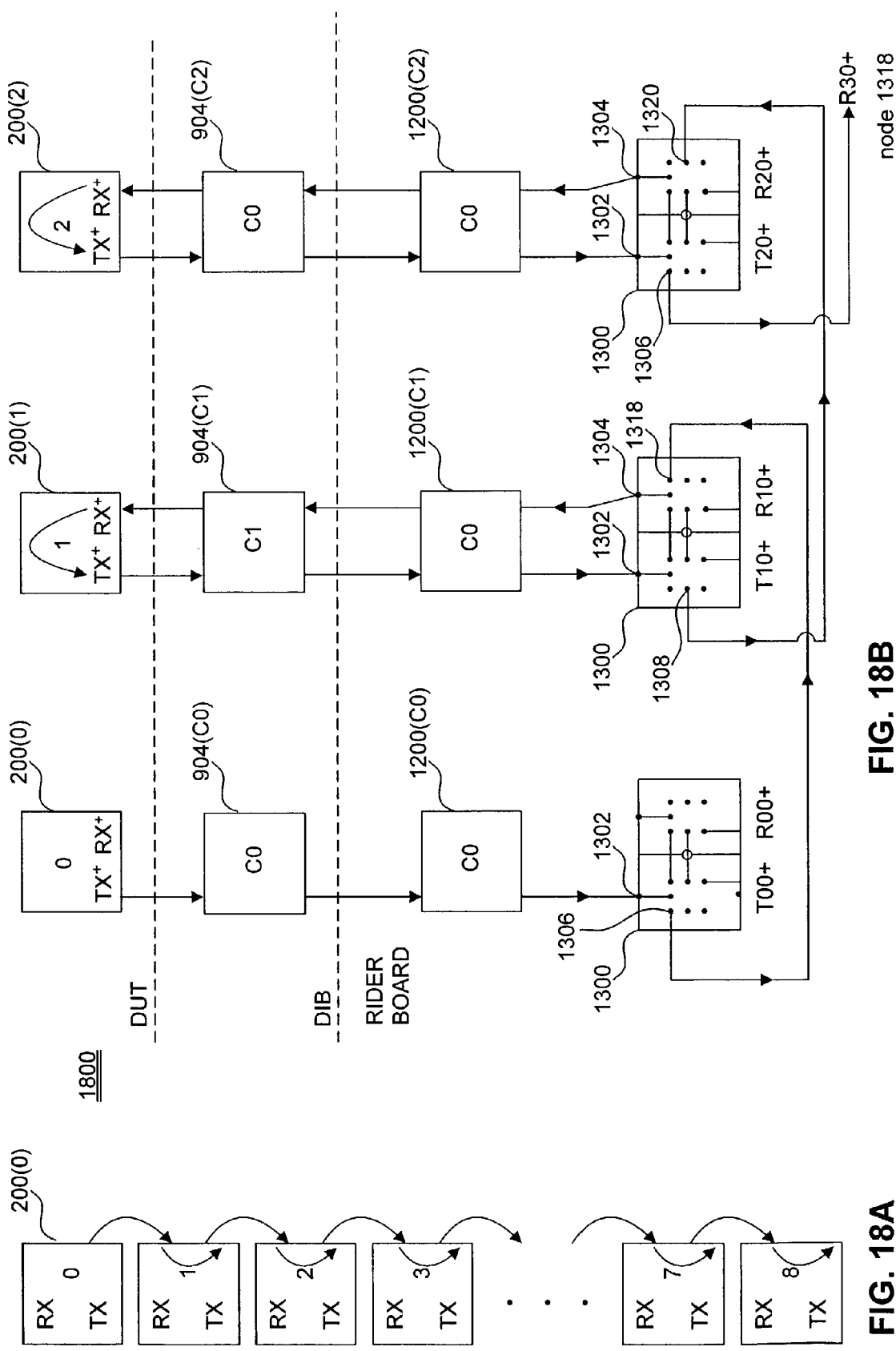

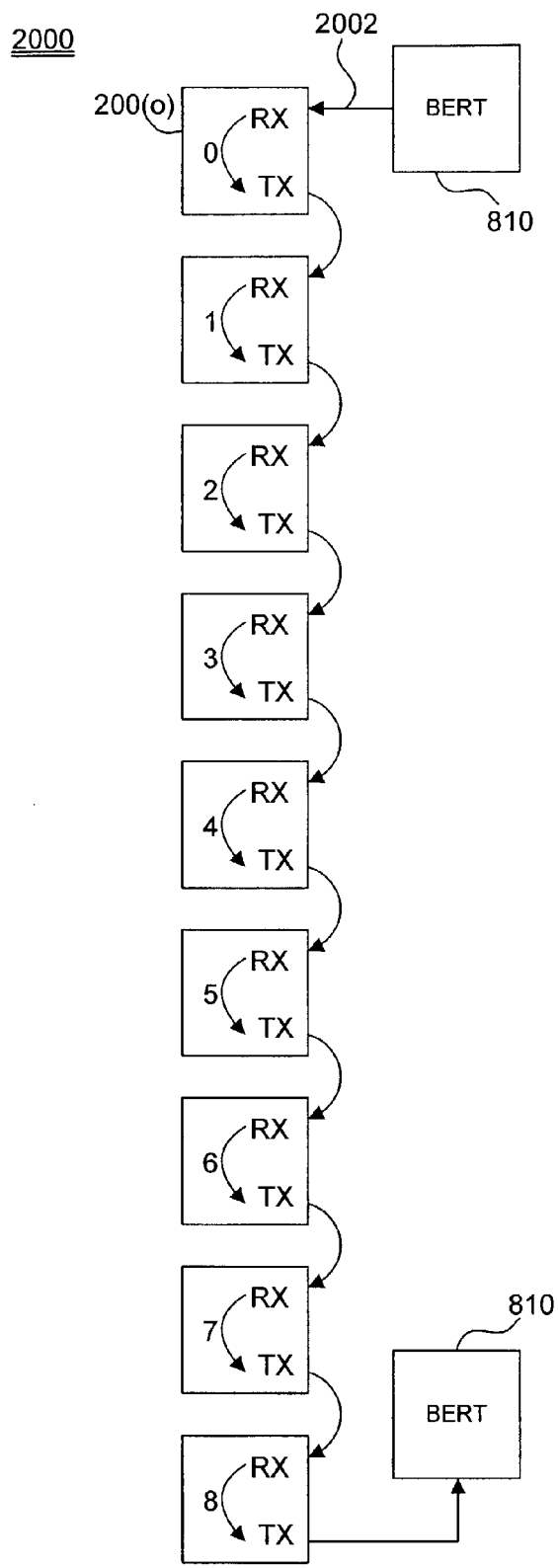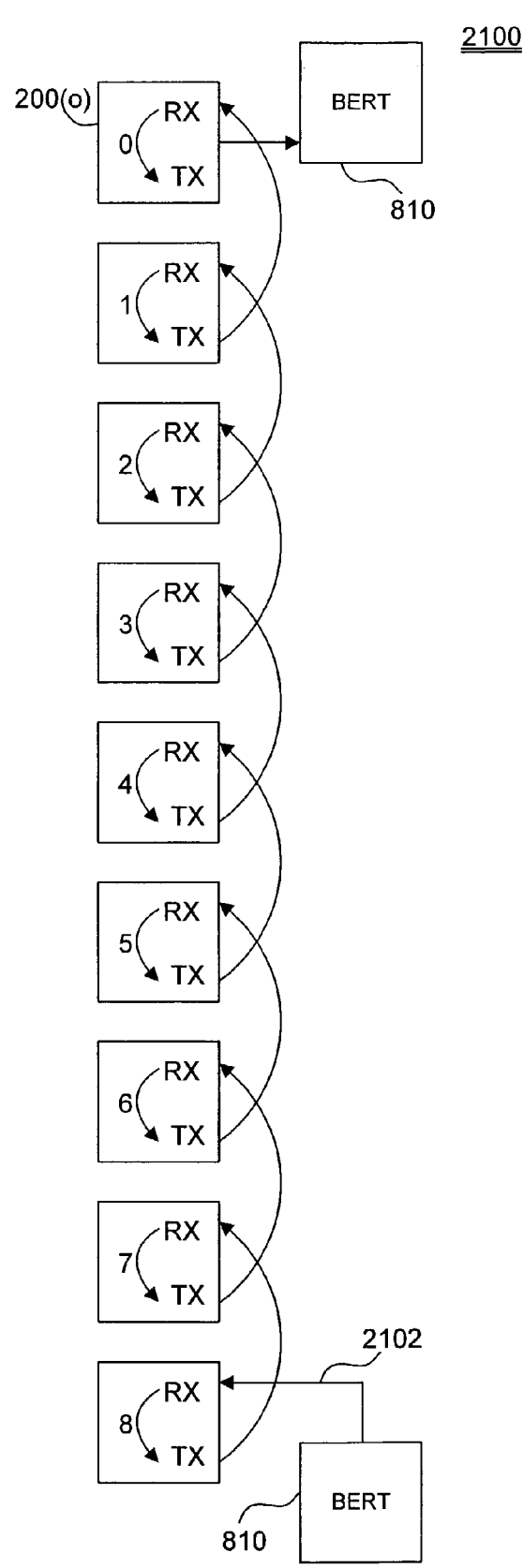
FIG. 20  FIG. 21

TEST SYSTEM RIDER UTILIZED FOR AUTOMATED AT-SPEED TESTING OF HIGH SERIAL PIN COUNT MULTIPLE GIGABIT PER SECOND DEVICES

CROSS-REFERENCE TO RELATED APPLICATIONS

This application claims priority to U.S. Prov. App. No. 60/371,673 filed Apr. 12, 2002, entitled "SYSTEMS AND METHODS FOR AT-SPEED AUTOMATED TESTING OF INTEGRATED CIRCUITS," which is incorporated by reference herein in its entirety.

This application is related to U.S. application Ser. No. 10/207,094, entitled "SYSTEM FOR AT-SPEED AUTOMATED TESTING OF HIGH SERIAL PIN COUNT MULTIPLE GIGABIT PER SECOND DEVICES"; U.S. application Ser. No. 10/207,093, entitled "METHODS USED TO SIMULTANEOUSLY PERFORM AUTOMATED AT-SPEED TESTING OF MULTIPLE GIGABIT PER SECOND HIGH SERIAL PIN COUNT DEVICES"; and U.S. application Ser. No. 10/207,196, entitled "TEST HEAD UTILIZED IN A TEST SYSTEM TO PERFORM AUTOMATED AT-SPEED TESTING OF MULTIPLE GIGABIT PER SECOND HIGH SERIAL PIN COUNT DEVICES", all filed concurrently herewith, which are all incorporated by reference herein in their entirety. This application is also related to U.S. application Ser. No. 10/411,194, filed Apr. 11, 2003.

BACKGROUND OF THE INVENTION

1. Field of the Invention

The present invention relates to automated testing systems and methods that perform at-speed testing of high serial pin count devices that transmit serial data at gigabit per second baud rates.

2. Related Art

Traditional testing systems for semiconductor devices employ automated testing equipment (ATE). Today, high-speed (e.g., gigabit per second (Gbps) baud rate) semiconductors can be quad serial data input/output I/O port (having 4 serial data pins per port coupled to 4 transmit/receive differential pairs) stand-alone physical layer devices (PHY's) or high port count integrated application specific integrated circuits (ASIC's), switches, or backplane transceivers. Most ATE's become perpetually outdated in terms of being able to perform at-speed testing (testing at the rated speed of the semiconductor device) of high speed devices with high serial pin counts. Presently, two main ATE's performing tests on high speed high serial pin count devices are the Teradyne Tiger and the Agilent 93000 test platforms that can deliver 1.25 Gbps on standard single ended channels, where Teradyne can deliver 1.6 Gbps differential channels and Agilent can deliver 2.5 Gbps differential channels. Aside from these ATEs, specialized high-speed test options can cost hundreds of thousands of dollars and usually offer very limited functionality.

Aside from automated testing systems, non-automated testing equipment systems utilize "serial external loopback" (device transmitter connected directly to device receiver) configurations for at-speed testing (testing at the rated speed of the semiconductor device). There are also some single channel ATE instruments, such as digitizers and sine wave sources, as well as bench instrumentation with a few channel capability, such as bit error rate testers (BERTs), that can be used to test some semiconductor devices. Unfortunately, these testing systems are only effective for semiconductor devices with a very small number of serial data pins and channels. This is because it can be difficult to route many devices with a high number of serial data pins to a single ATE source or capture instrument due to limit device interface board (DIB) space allowed for application circuitry on test heads. Also, bench instrumentation are an expensive upgrade solution to an ATE and typically are not production worthy. Further, test time, which contributes to the cost of testing, is very high on bench instrumentations because they are not designed for automated production testing.

To overcome some of these problems, other systems have utilized a golden device concept. In these systems a same or complementary functioning semiconductor device as the device under test (DUT) is used as a golden device to test itself. For example, when the speed of a serializer is too fast for an ATE then a deserializer can be used to bring down the speed into a range in which the ATE can test. However, the use of the golden device becomes non-trivial when the serial data pin and channel count of a DUT increases. This is because the test complexity is compounded by the need to have connections to the golden device, external loopback devices, and analog instrument device for signal routing on one DIB, which makes the signal delivery or signal routing too complex to design for high serial pin counts.

Consequently, a result of all these problems has been a dramatic decrease in at-speed production test coverage. This has both lowered the quality of semiconductor devices and raised the rate of field defects and failures.

Therefore, an ATE is needed that is capable of at-speed testing of multiple Gbps and higher semiconductor devices with high serial pin counts that can be easily adapted to keep up with the constantly changing device speeds and configurations and that will be small enough to fit in the limit real estate available on a DIB. There is also a need for the ATE to have low capital costs for upgrades.

BRIEF SUMMARY OF THE INVENTION

Embodiments of the present invention provide a testing system for simultaneous automated at-speed testing of a plurality of devices that generate serial data signals having gigabit per second baud rates coupled to a DIB and device connectors on the DIB. The testing system includes a rider board including rider board connectors coupled to corresponding ones of the device connectors, an individual set of multiplexers coupled to each one of said rider board connectors, a controller coupled to each of said set of multiplexers, and an internal testing system including a tester and testing system multiplexers, said tester being coupled to each of said set of multiplexers via said testing system multiplexers.

An advantage of the embodiments of the present invention is that testing devices having high serial pin counts (e.g., 72 channels coupled to 72 pins) has a low capital cost, usually less than $5000.00.

Another advantage of the embodiments of the present invention is that the rider board has the ability to route DUT high-speed (e.g., gigabit per second baud rate) serial signals with adequate signal integrity to key test resources to obtain the highest level of test coverage. Thus, a testing system can perform at-speed testing on 72 channels, which accommodates even the highest integrated semiconductors manufactured to date. Also, there is no compromise on test coverage because the rider board also allows any serial pin to be routed to: other device pins for external loopback or snaking, BERT engines, ATE digital pins, and ATE analog pins.

A still further advantage of the embodiments of the present invention is that the testing system is capable of at-speed or high speed testing. This allows for at-speed testing of devices under test with random data sequences and specification compliant data packets. Also, a BERT engine tests the devices in real time and does not sub-sample or under-sample. The rider board BERT channels are clock and data recovery (CDR) based and are not reliant on phase or frequency of DUT signals and timing.

A still further advantage of the embodiments of the present invention is that because the rider board is installed as a "daughter board" to the DIB, the rider board does not interfere or require the removal of any ATE pin electronics. This is in sharp contrast to the prior art that required the removal of ATE tester standard digital pins from the ATE test system when installing new options in the ATE testers. That prior art systems and methods made the ATE test system less effective and not configured correctly for other high pin count devices.

A still further advantage of the embodiments of the present invention is that the rider board is easily and inexpensively upgradeable as the speed of tested devices increase. As an example, systems and methods according to embodiments of the present invention can test at least 5 Gbps and 6.25 Gbps devices.

A still further advantage of the embodiments of the present invention is that the rider board's RF connections to tester are generic, which means the rider board can be directly connected to any ATE instrument. In some embodiments, up to two differential ATE digitizers or bench instruments and up to 5 differential pairs of ATE sources or bench instruments can be connected. Also, if a future ATE analog instrument or a new bench instrument is required for testing a particular device specification, the rider board inherently can accommodate it.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 16 shows exemplary connections between a tester, a test head, and a rider board in the system in the preceding figures.

FIG. 17A pictorially illustrates an exemplary self loop-back method of testing a device under test (DUT) according to embodiments of the present invention.

FIG. 17B pictorially illustrates an exemplary full duplex adjacent core loopback method in a first direction of a DUT according to embodiments of the present invention.

FIG. 17C pictorially illustrates an exemplary full duplex adjacent core loopback method in a second direction of a DUT according to embodiments of the present invention.

FIG. 18A pictorially illustrates an exemplary internal snake down testing method of a DUT according to embodiments of the present invention.

FIG. 18B illustrates a signal path through elements in the system during the internal snake down testing method of FIG. 18A.

Figures 19A, 19B:
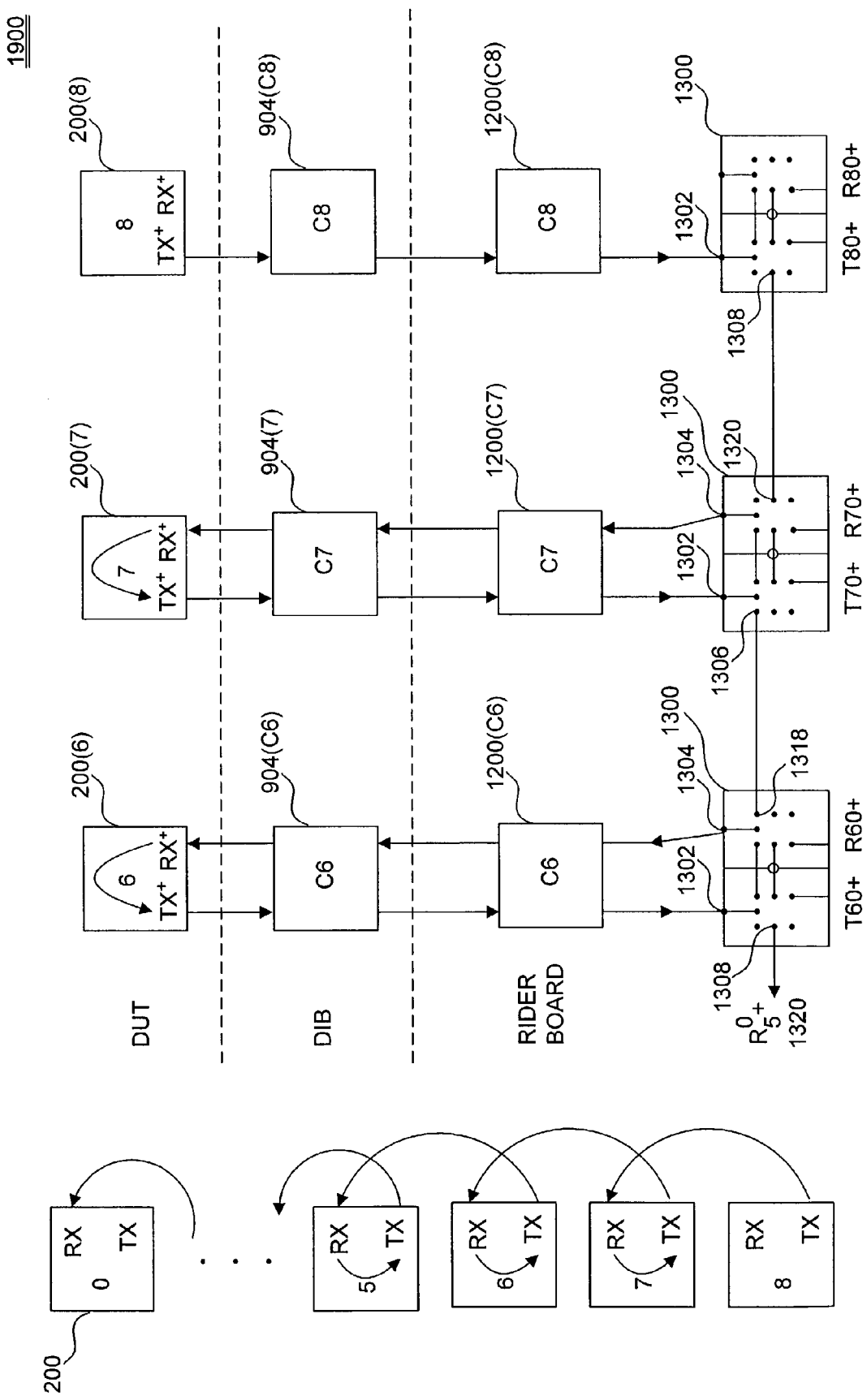

FIG. 19A pictorially illustrates an exemplary internal snake up testing method of a DUT according to embodiments of the present invention.

FIG. 19B illustrates a signal path through elements in the system during the internal snake up testing method of FIG. 19A.

FIG. 20 pictorially illustrates a flow path of a signal during an exemplary external snake down testing method of a DUT according to embodiments of the present invention.

FIG. 21 pictorially illustrates a flow path of a signal during an exemplary external snake up testing method of a DUT according to embodiments of the present invention.

Figure 22A:
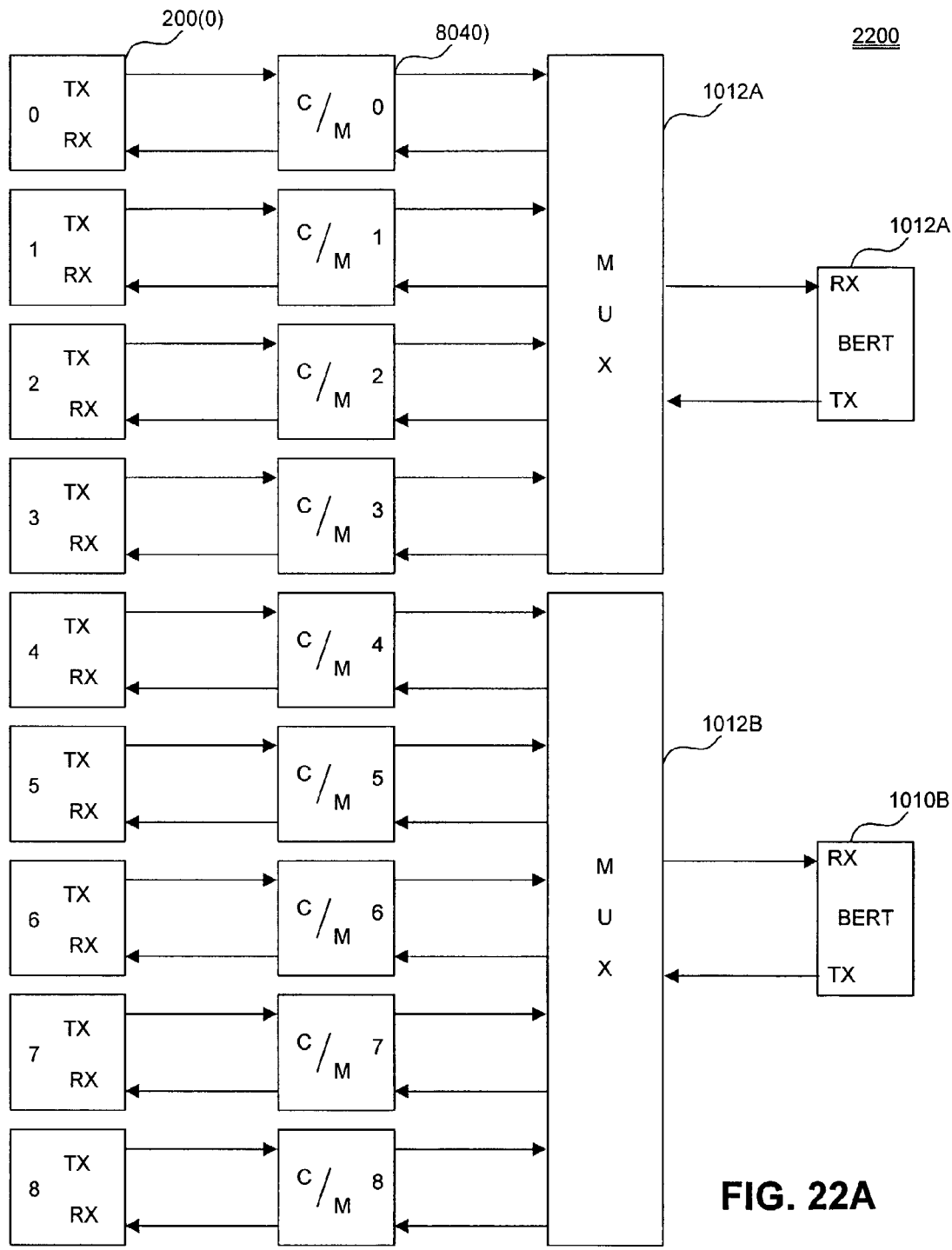

FIG. 22A shows an exemplary bit error rate tester (BERT) configuration to perform BERT testing methods of a DUT according to embodiments of the present invention.

Figure 22B:
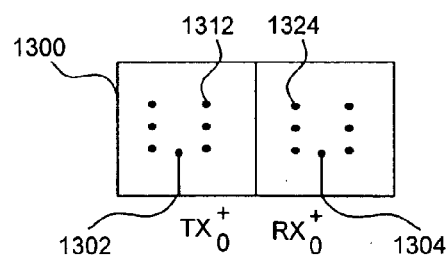

FIG. 22B shows an exemplary multiplexer configuration to perform the operation in FIG. 22A.

Figure 23A:
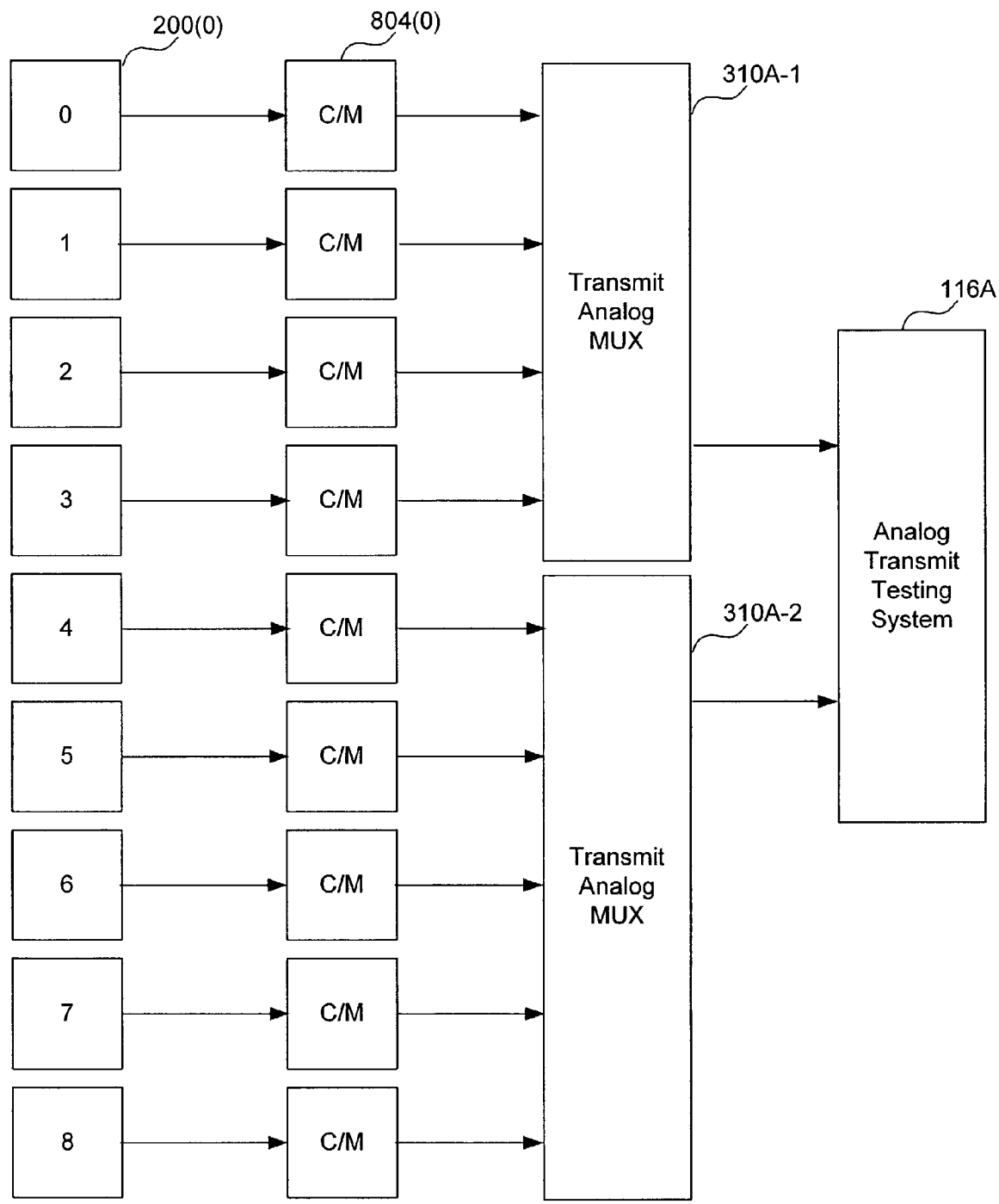

FIG. 23A shows an exemplary transmit analog testing system configuration to perform analog testing methods of transmit pins of a DUT according to embodiments of the present invention.

Figure 23B:
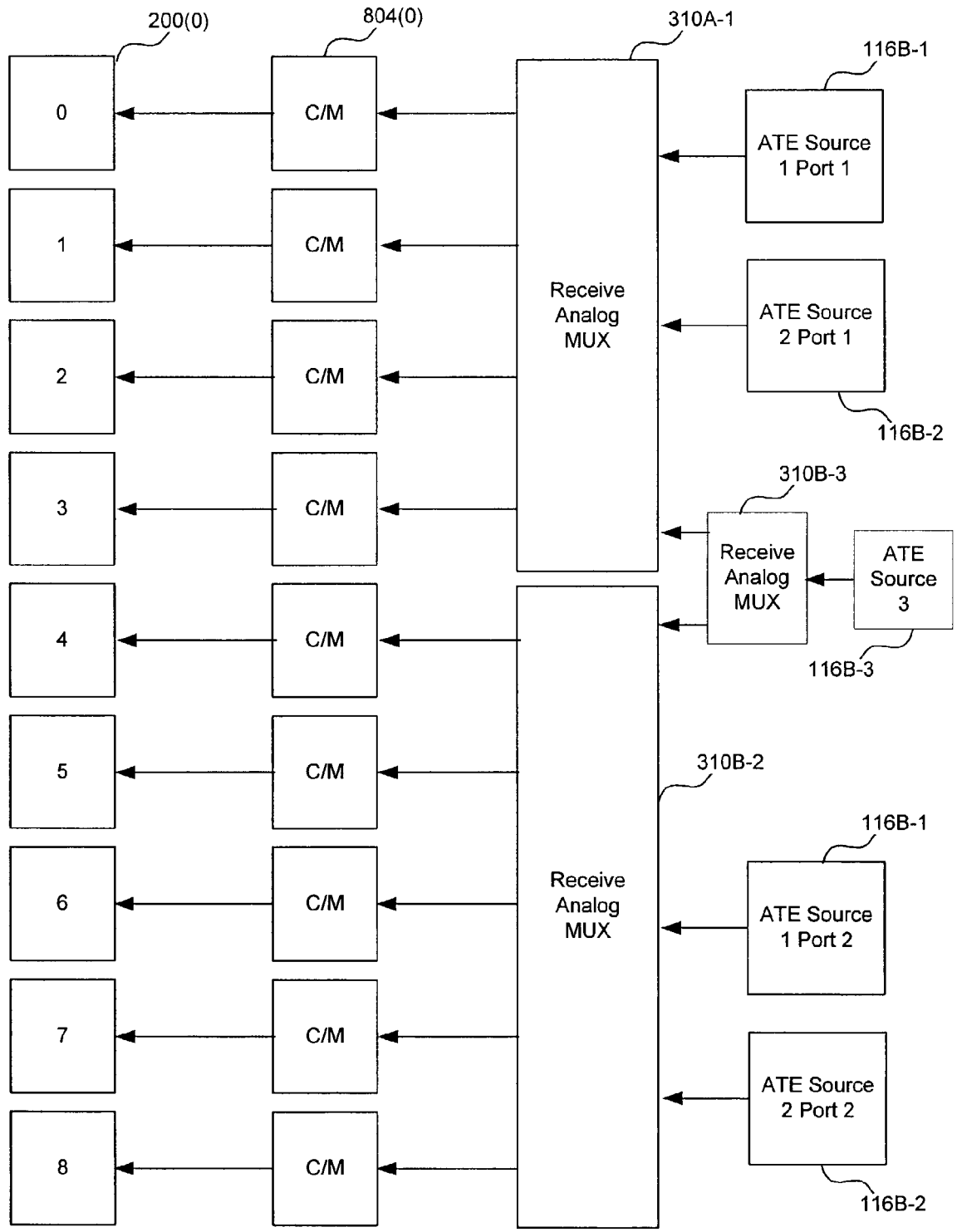

FIG. 23B shows an exemplary receive analog testing system configuration to perform analog testing methods of receive pins of a DUT according to embodiments of the present invention.

Figure 24:
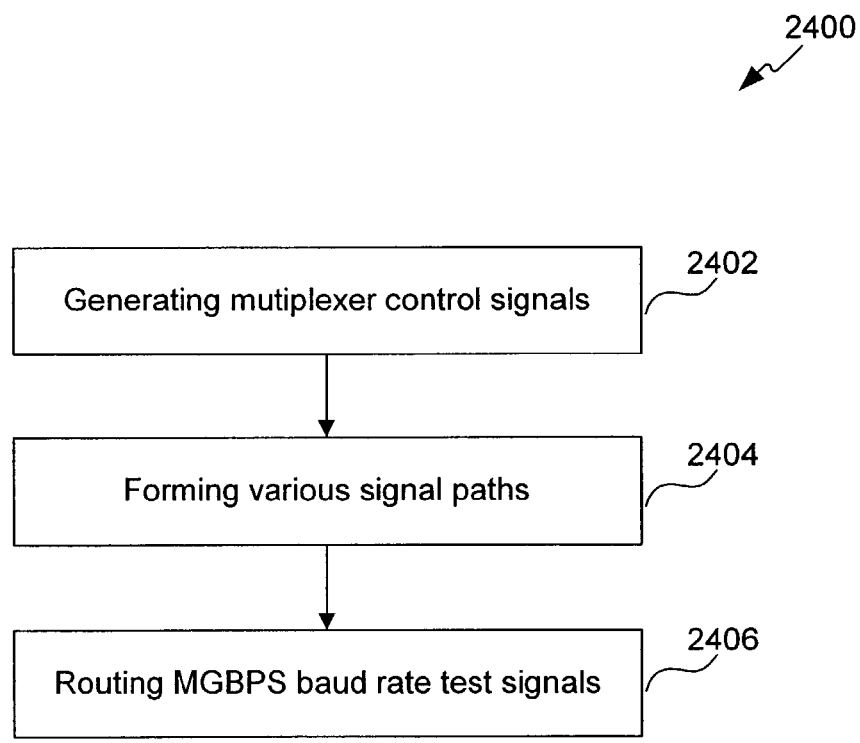

FIG. 24 illustrates a flow chart depicting a method according to embodiments of the present invention.

Figure 25:
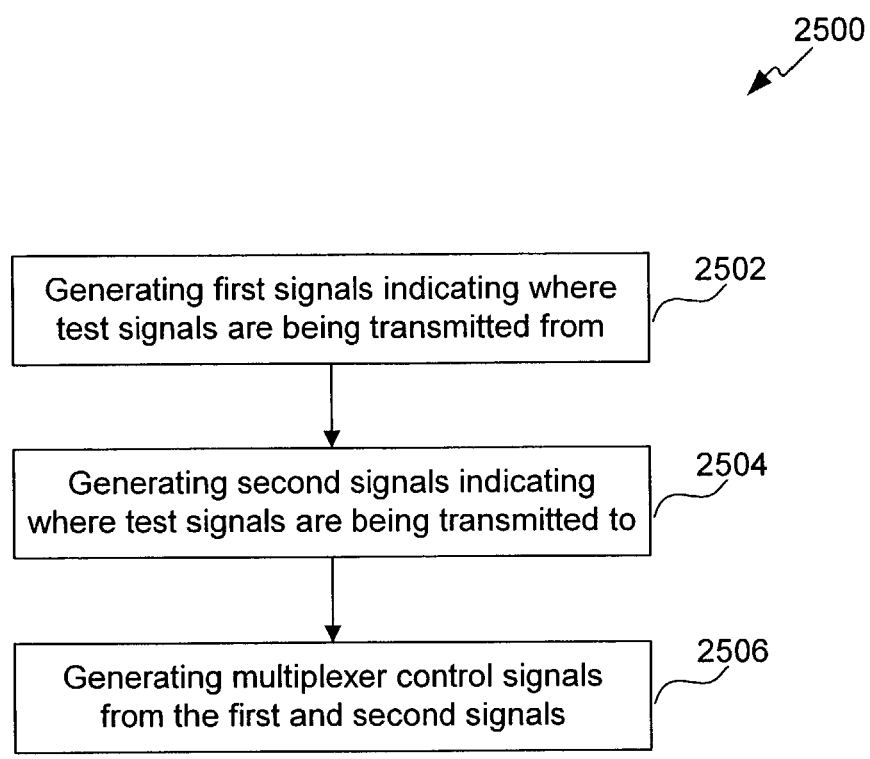

FIG. 25 illustrates a flow chart depicting a method occurring during the method in FIG. 24.

Figure 26:
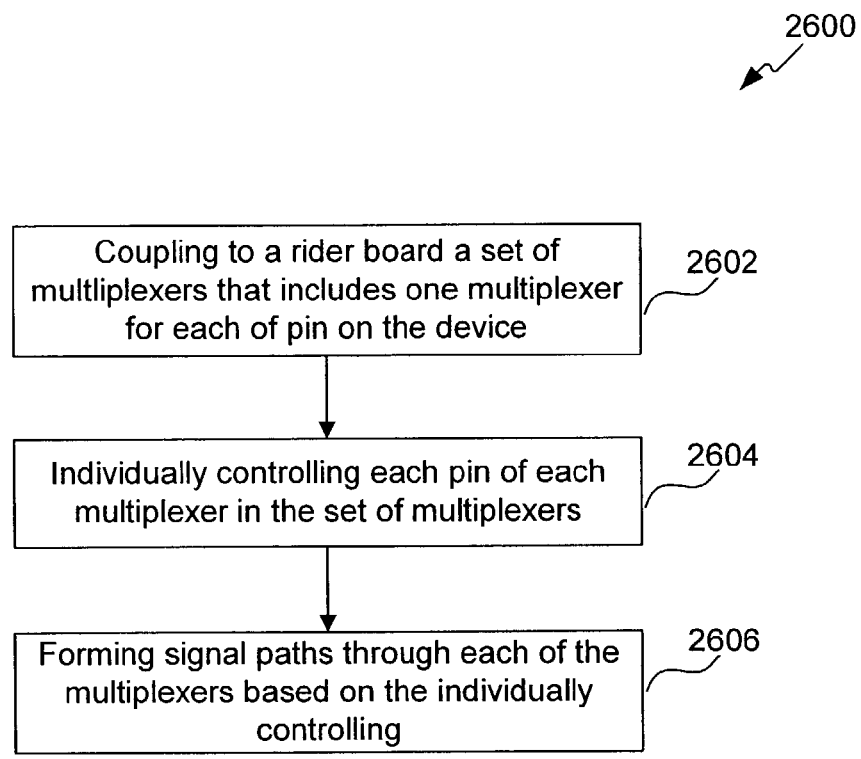

FIG. 26 illustrates a flow chart depicting a method according to embodiments of the present invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Overview of Testing System and Operation

Figure 1A:
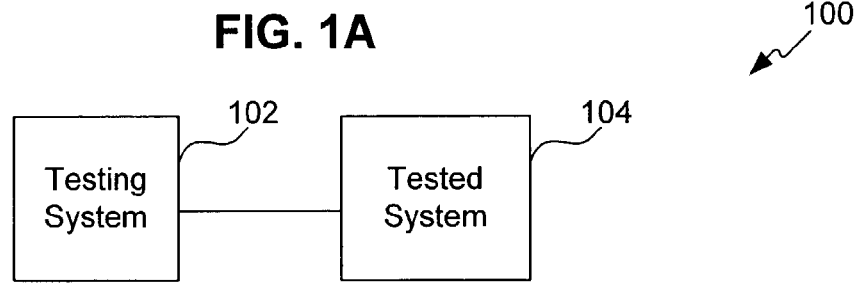
FIG. 1A shows an exemplary testing system according to embodiments of the present invention.
Figure 1B:
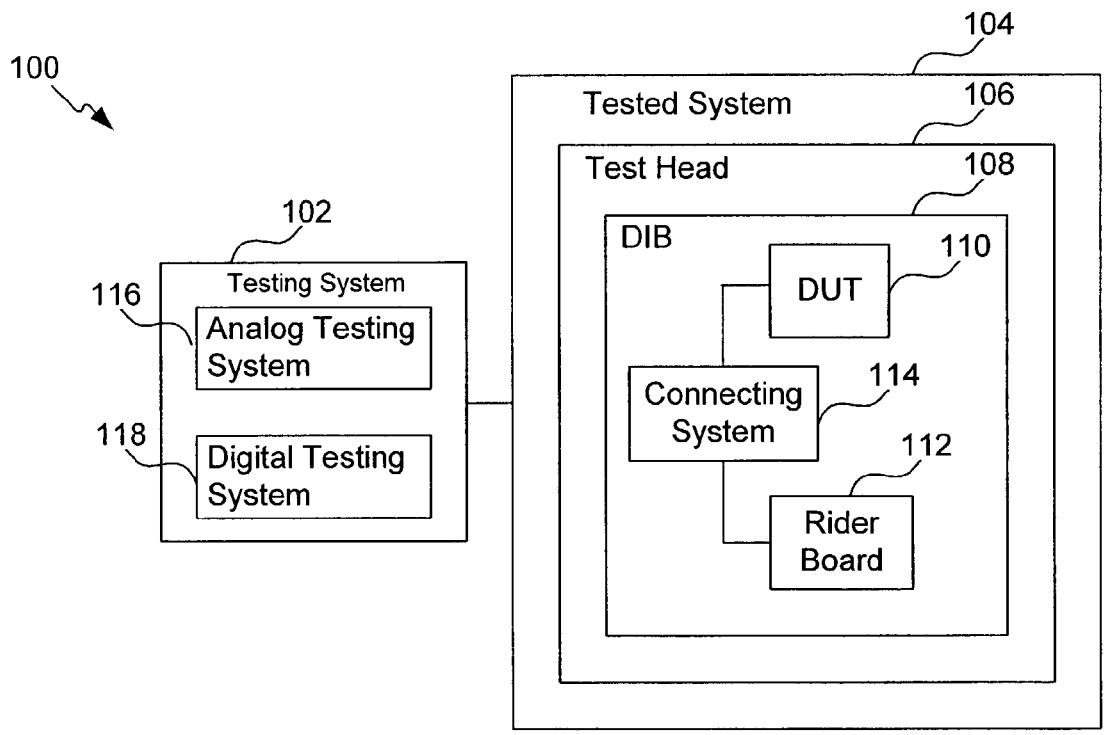
FIG. 1B shows a more detailed view of the testing system in FIG. 1A.
Figure 1C:
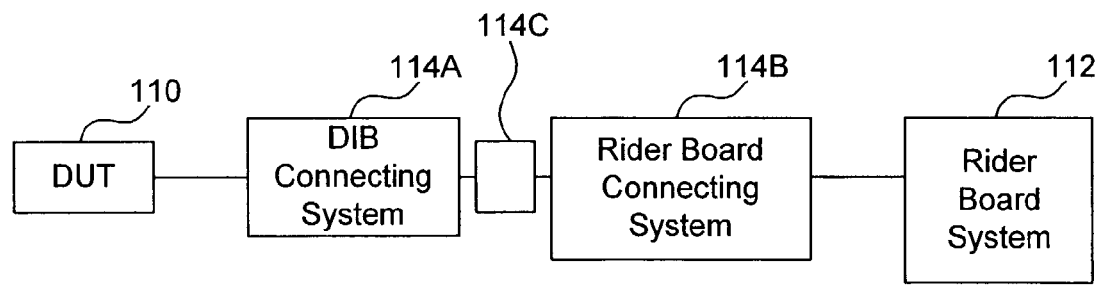
FIG. 1C shows connections between elements in the testing system in FIGS. 1A–1B.

According to embodiments of the present invention, an automated testing system 100 comprises a testing system (e.g., automated test equipment (ATE)) 102 coupled to a tested system 104, as shown in FIGS. 1A–1C. The ATE 102 can be a Teradyne Tiger ATE or any other ATE now developed or developed in the future. The tested system 104 includes a test head 106 that includes a device interface board (DIB) 108 having a device under test (DUT) holding device 110, which can be a socket or contactor. The DIB 108 is coupled to a rider board 112 via a coupling system 114 (114A–114C). The rider board 112 can be essentially a "daughter" board that connects to a surface the DIB 108 opposite a surface with the DUT holding device 110 via board connectors 114C, which may be high-density parallel board connectors described in more detail below with reference to FIGS. 6 and 10. The ATE 102 includes analog 116 and digital 118 signal stimulus and capture/measure devices.

It is to be appreciated that throughout the specification the use of "coupled" can mean electrically coupled, mechanically coupled, or both depending on the situation so that signals can be routed through the system 100. Also, throughout the specification, the use of "internal" and "external" testing systems refer to whether the testing system is on rider board 112 (internal) or not on rider board 112 (external).

Figure 2:
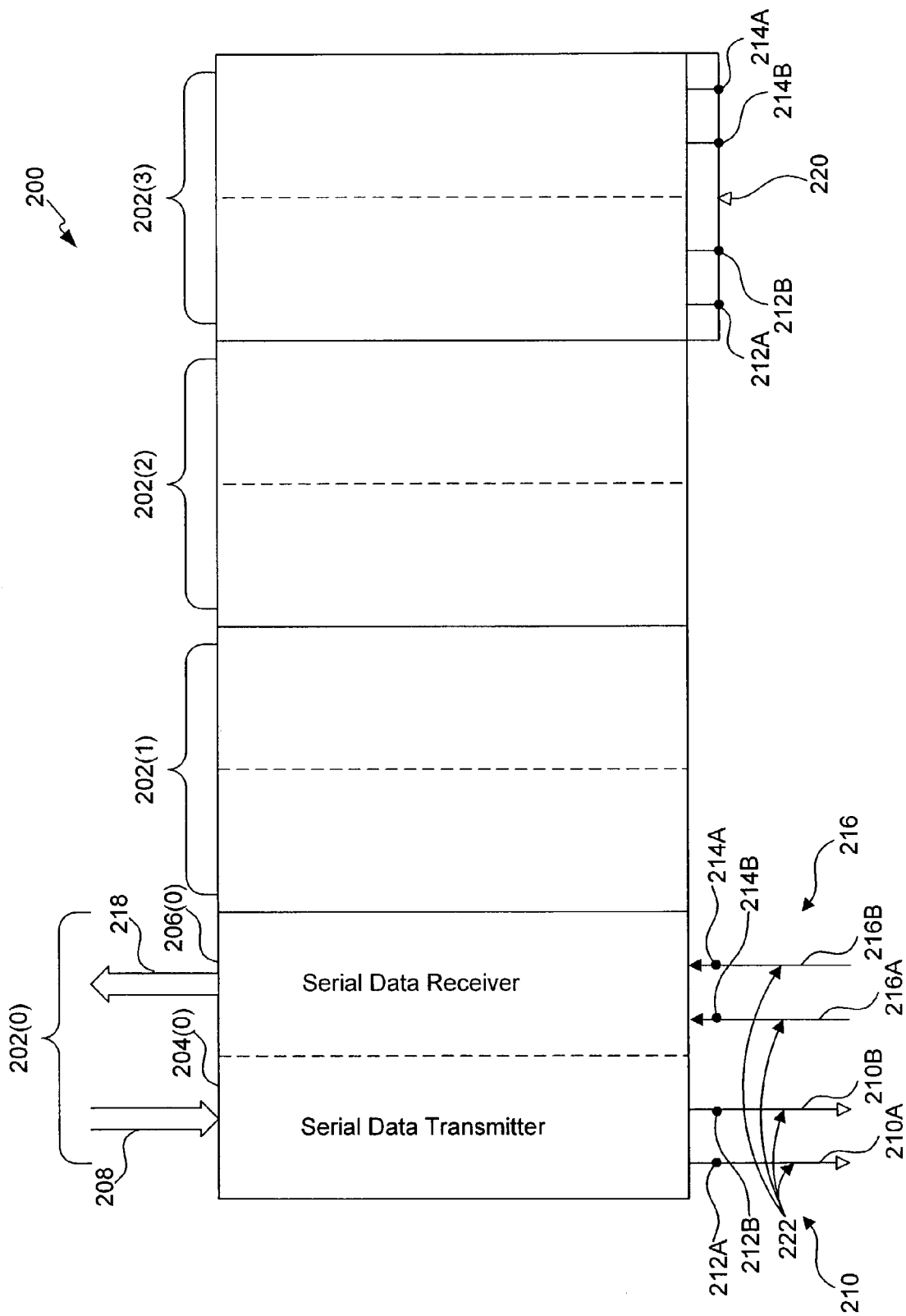
FIG. 2 shows device under test according to embodiments of the present invention.

FIG. 2 shows a device 200 secured by the DUT holding device 110 according to embodiments of the present invention. The device 200 can be a transmitter-receiver (transceiver) device including a plurality of transceivers 202(0–3). In some embodiments, device 200 can be a serializer-deserializer (SerDes) device, as will be described below. Device 200 can be constructed on a single IC substrate. As an example, transceiver 202(0) includes a serial data transmitter 204(0) and a serial data receiver 206(0). The transmitter 204(0) receives parallel data 208 over a parallel bus (not shown). Transmitter 204(0) converts parallel data 208 into a serial data signal 210 that travels through channels 222 (e.g., wires, microstrip, conductive material, etc). The transmitter 204(0) includes output pins 212A and 212B coupled to corresponding ones of channels 222. Transmitter 204(0) transmits a serial data signal 210 as a differential serial data signal including first and second differential data signals 210A and 210B (also referred to as digital data signal components 210A and 210B), which are complementary to each other. Transmitter 204(0) transmits serial data signals 210A and 210B from respective pins 212A and 212B through respective channels 222. Data signals 210A and 210B (signal 210) have baud rates in the multi-gigabit per second range.

With continuing reference to FIG. 2, the receiver 206(0) includes input pins 214A and 214B coupled to respective channels 222 for receiving a differential serial data signal 216. Serial data signal 216 includes first and second differential signals 216A and 216B, which have baud rates in the multi-gigabit per second range. Receiver 206(0) converts the serial data signal 216 into a corresponding parallel data signal 218, and transmits the parallel data signal over a parallel data bus (not shown). The remaining transceivers 202(1-3) are configured and operate in substantially the same manner as transceiver 202(0). The serial input/output (I/O) portion of each transceiver 202, which includes the pins 212A–B and 214A–B, is referred to as a port 220.

In some embodiments, there are nine devices 200 with four ports 220 per device. Thus, there are 36 ports with 36 pairs of serial transmit and receive differential signals 210 and 216, totaling 72 differential signals 210 and 216, and 144 pins 212 and 214 having baud rates in the multi-Gbps range. Throughout the specification, the device 200 is referred to interchangeably as a device or core and the port 220 is referred to interchangeable as a port or a lane.

One example of a device 200 can be a SerDes Chip manufactured by Broadcom Corporation. This chip is further described in: U.S. provisional application titled, "High-Speed Serial Transceiver," Ser. No. 60/200,813, filed Apr. 28, 2000; U.S. non-provisional patent application titled, "Timing Recovery and Frequency Tracking System and Method," Ser. No. 09/844,432, filed Apr. 30, 2001; U.S. non-provisional patent application titled, "Timing Recovery and Phase Tracking System and Method," Ser. No. 09/844,296, filed Apr. 30, 2001; U.S. non-provisional patent application titled, "Methods and systems for adaptive receiver equalization," Ser. No. 09/844,283, filed Apr. 30, 2001; U.S. non-provisional patent application titled, "High-Speed Serial Data Transceiver and Related Methods," Ser. No. 09/844,441, filed Apr. 30, 2001; and U.S. non-provisional patent application titled, "Phase Interpolator Device and Method," Ser. No. 09/844,266, filed Apr. 30, 2001, all of which are incorporated herein by reference in their entireties.

With continuing reference to FIGS. 1A–1C, 2, 3, and 7, the system 100 is configured to allow the DUT holding device 110 to hold a plurality of high serial pin count devices 200. The system 100 routes serial data at high speeds (e.g., at gigabit per second baud rates). The devices 200 are coupled to each other and the ATE 102 in various connectivity configurations via a multiplexing system 302 and a controlling system 306 on the rider board 112, described in more detail below. These systems on the rider board 112 allow for simultaneous functional, parametric, analog, and digital at-speed testing. At-speed testing means that the testing is performed at the rated I/O speed of the semiconductor device 200. By performing simultaneous at-speed testing, the testing time, and in turn the testing costs, are reduced 1/x for x devices.

Figure 3:
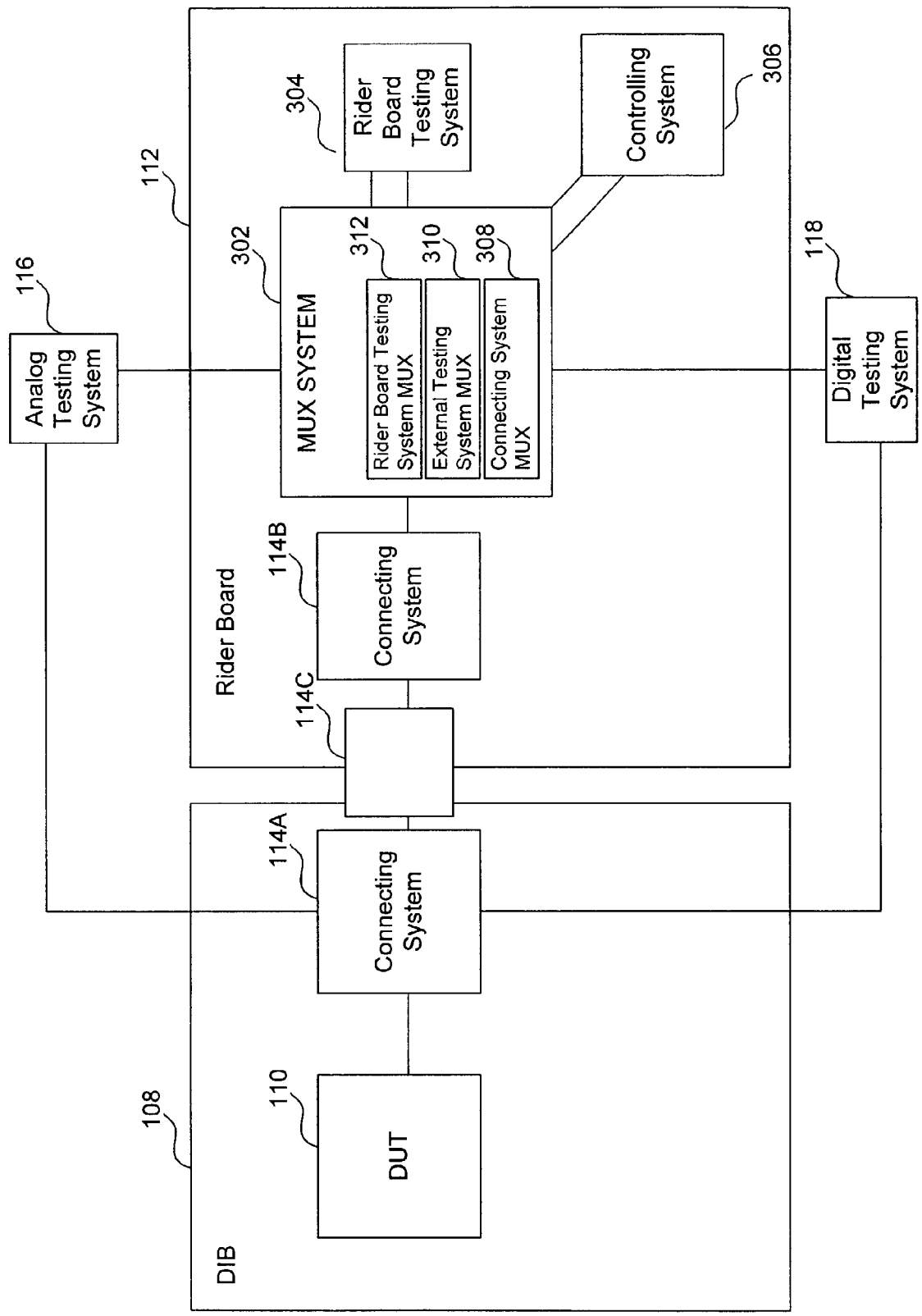
FIG. 3 shows details of the testing system in FIGS. 1A–1C.
Figure 7:
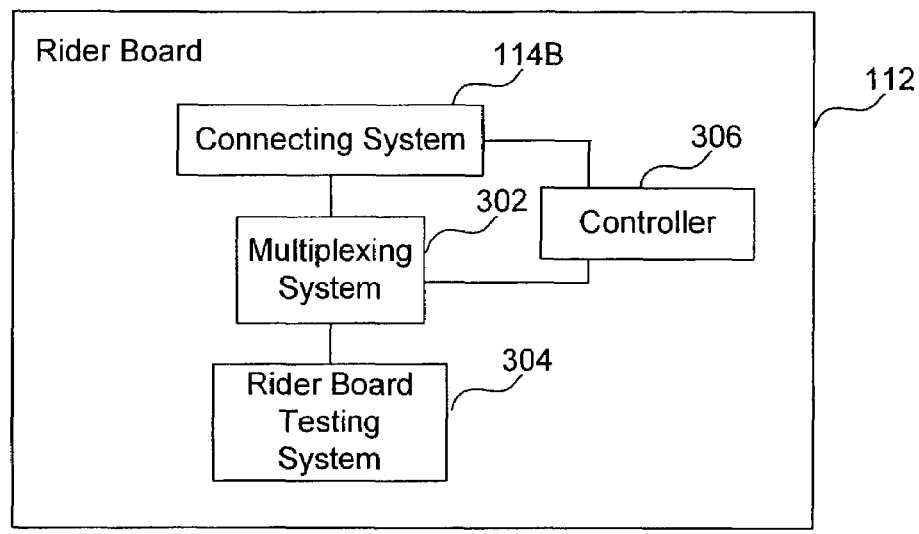
FIG. 7 shows elements on an exemplary rider board according to embodiments of the present invention.

As seen in FIGS. 1C, 3, and 7 the rider board 112 is coupled to the DIB 108 via the coupling system 114, which includes nine connectors 114A on the DIB 108 and nine corresponding connectors 114B on the rider board 112 that are coupled via connector 114C. In some embodiments, more or less connectors can be provided based on the amount of devices 200 being tested. Also, in some embodiments receptacle or female type connectors 114A can reside on the DIB 108 and plug or male type connectors 114B can reside on the rider board 112, or vice versa. The connectors 114A and 114B are coupled together via board connectors 114C, described in more detail below. Each connector 114B on the rider board 112 is coupled to a core/connecting system multiplexer 308 in multiplexing system 302. Throughout the specification, the multiplexing system 302 can be interchangeably referred to as a multiplexing system, a switching matrix, a switching fabric, or the like. When there are devices 200 installed in holding device 110, the main core mulitplexer 308 connects from each device 200 to: a transmit analog mulitplexer 310A (FIG. 10) in the multiplexing system 302, a receive analog multiplexer 310B (FIG. 10) in the multiplexing system 302, and an internal testing system multiplexer 312 (FIG. 10) in the multiplexing system 302. The internal system multiplexer 312 is coupled to an internal testing system 304, which can include bit error rate test engines (BERT engines). In some embodiments, the multiplexing system 302 can be made up of 226 high bandwidth GaAs switches 1202 (FIG. 12) controlled by a controlling system 306 via over 600 control lines. The controlling system 306 can include two field programmable gate array (FPGA) controllers 808 (FIGS. 8A, 10, 11, and 15).

Test Head

Figure 4:
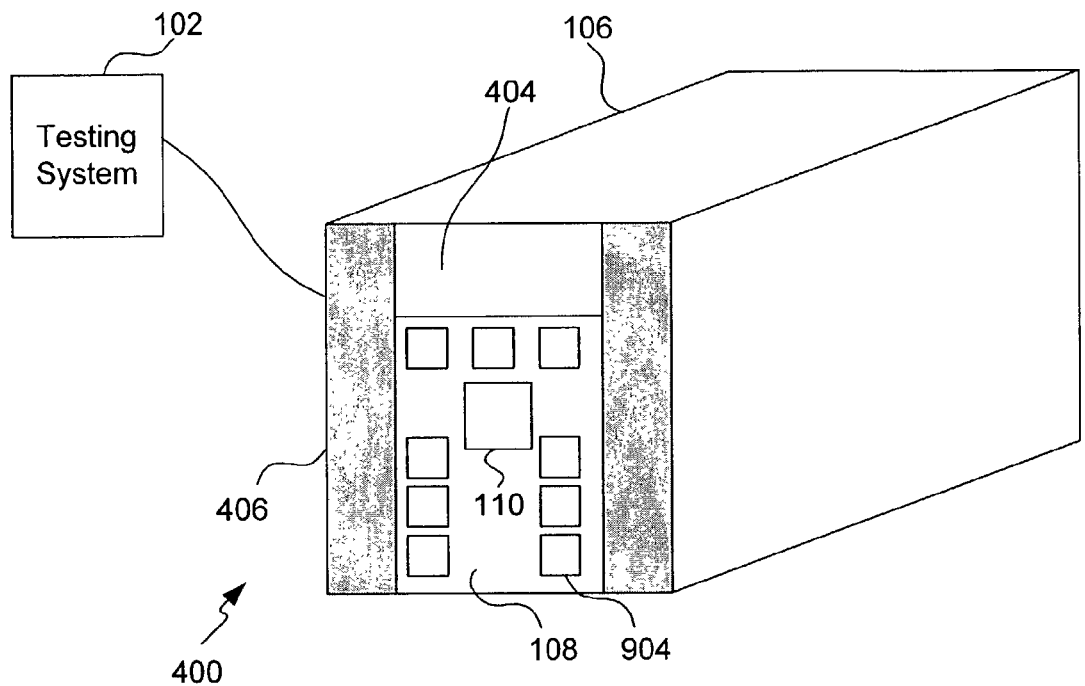
FIG. 4 shows an exemplary perspective view of a testing head from a first side in the system of in the preceding figures.

FIG. 4 illustrates a perspective view of a portion 400 facing outward from the test head 106 according to embodiments of the present invention. The portion 400 of the test head 106 includes the DIB 108 with the DUT holding device 110 and DIB connectors 904 (FIG. 9), which are part of the DIB connecting system 114A. Also, the portion 400 includes a restricted section 404 and a coupling or connection section 406, which couples the external testing system 102 to the test head 106. As was discussed above, the test head 106 generally has some areas that cannot include any additional user or proprietary equipment or devices. The restricted section 404 is located in these areas. This, along with the coupling or connection section 406, substantially reduces the available space on the test head 106 for the DIB 108. This has in prior art systems limited the space available to couple more than a two DUTs because of the amount of space needed for their respective connection wiring. Thus, according to embodiments of the present invention, in order to test a plurality of devices 200, such a nine devices, connections between different ones of the devices 200 are provided by the multiplexing system 302 and control system 306 on the rider board 112, as will be described in more detail below.

Figure 5:
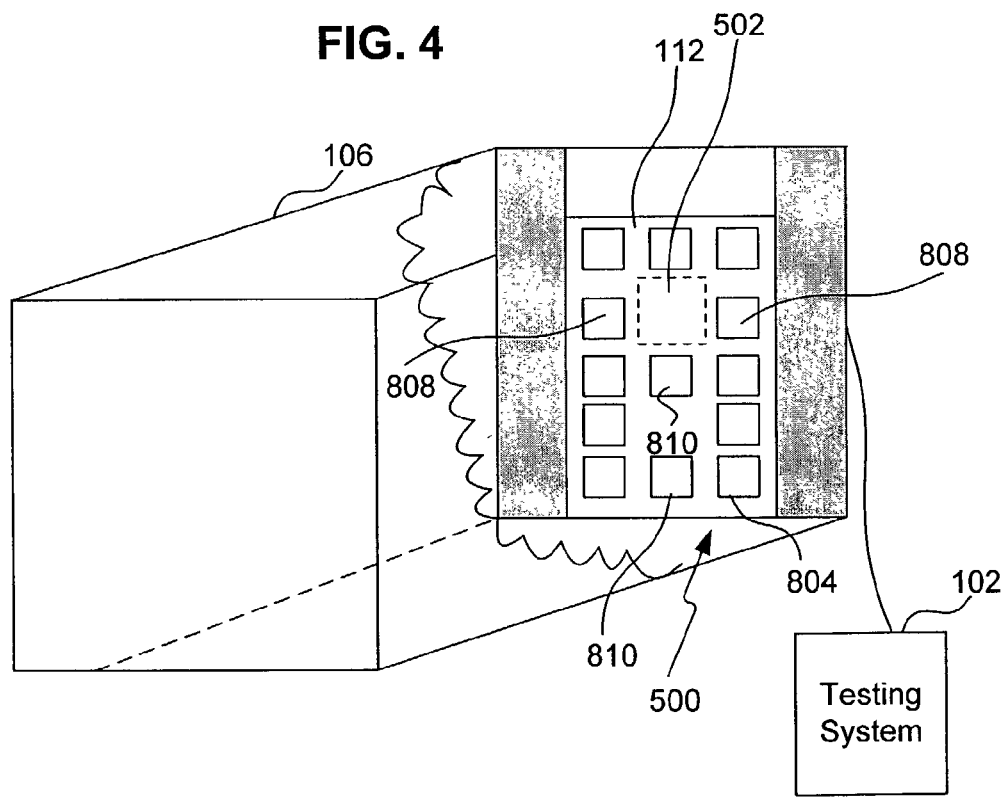
FIG. 5 shows an exemplary perspective view of a testing head from a second side with a cut-out portion showing a rider board coupled to an inside surface of the testing head in the system in the preceding figures.

FIG. 5 illustrates a perspective view with a cut-away section showing a portion 500 facing inward from the test head 106 according to embodiments of the present invention. The portion 500, which is coupled on a surface of the test head 106 opposite a surface with the DUT holding device 110, is substantially made up of the rider board 112. The dashed square 502 on the portion 500 is where the DUT holding device 110 resides on the DIB 108. The portion 500 includes connectors 804 (FIG. 8), which are part of the rider board connecting system 114B. The connectors 804 correlate with and are coupled to the connectors 904 via connectors 114C. The portion 500 also includes controllers 808 (FIG. 8), which are part of the controlling system 306, and testers 810 (FIG. 8), which are part of the internal testing system 304.

Figure 6:
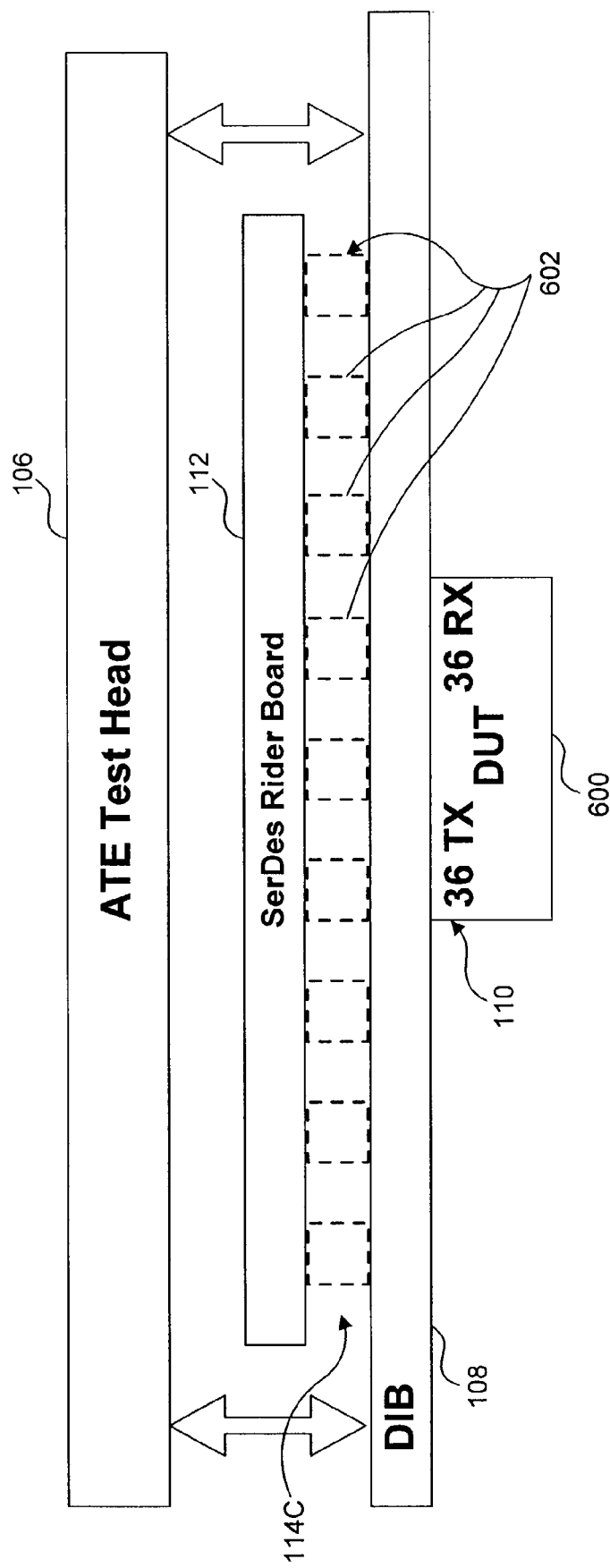
FIG. 6 shows an end view of exemplary connections between elements in a testing system in the preceding figures.

FIG. 6 illustrates an end view of a portion of the system 100 according to embodiments of the present invention. As can be seen, a DUT 600 is coupled to the DUT holding device 110 on the DIB 108. Also, the DIB connecting system 114A (not shown in this figure) are coupled via connectors 602, which are part of the connector 114C, to the rider board connectors 114B (not shown in this figure). The connector 114C can be a Teradyne connection system called "NexLev" that is rated to carry signals at to over 3.2 Gbps with a density of 145 signals per inch. For example, if the DUT 600 includes nine cores 200 there would be nine connectors 602 (one for each core), which would provide 100 signal pins and 90 grounds per connector, or a total capacity of 900 signals.

Accordingly, in order to accommodate nine devices 200, the rider board 112 is utilized to move all signal switching/multiplexing functions 302 and the internal testing system 304 off of the DIB 108. Hence, the necessary real estate needed on the DIB 108 for the DUT holding device 110 that can hold a plurality of cores 200, for example nine cores 200 with 36 transmit and receive differential serial pairs, remains.

Rider Board and DIB

Figure 8:
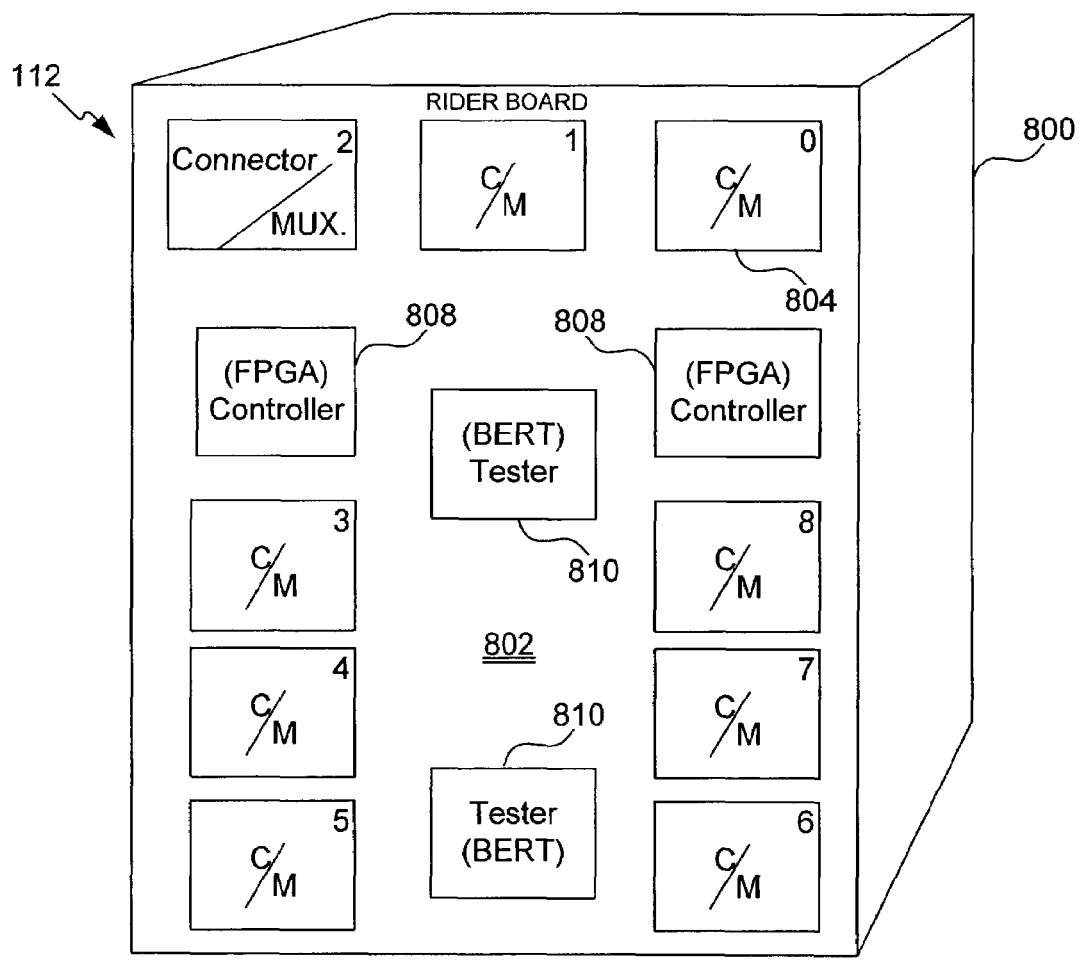
FIG. 8 shows a more detailed view of elements on a rider board in the system in the preceding figures.

As seen in FIG. 8, the rider board 112 according to embodiments of the present invention includes multiple connecting sections 800. Each of the connecting sections 800 includes hundreds or thousands of connecting devices (not shown), which can be copper strips, wires, fiber optics, or the like. The connecting devices couple all the components in the system 100 together in various configurations to route a testing signal through the system 100 in order to perform the various automated testing operations described below. In one embodiment, there are twenty connecting sections 800. Most of the components of the rider board 112 are located on a top section 802 of the connecting sections. The top section 802 includes connector/multiplexer devices 804 (labeled C/M-0 through C/M-8). The C/M devices 804 are comprised of the connectors 114B and a set of multiplexers in the multiplexing system 302. Although nine C/M devices 804 are shown, it is to be appreciated there may be more of less based on the amount of cores 200 being tested. The rider board 112 further includes controllers 808 and testers 810. The controllers 808 can be field programmable gate array (FPGAs) in the controlling system 306. The testers 810 can be BERT and/or PRBS (pseudo random bit sequence) engines in the testing system 304. The BERT engines 810 can be located in SerDes devices (similar to devices 200) utilized in the testing system 304, which allows for the at-speed testing of the cores 200.

Figure 9:
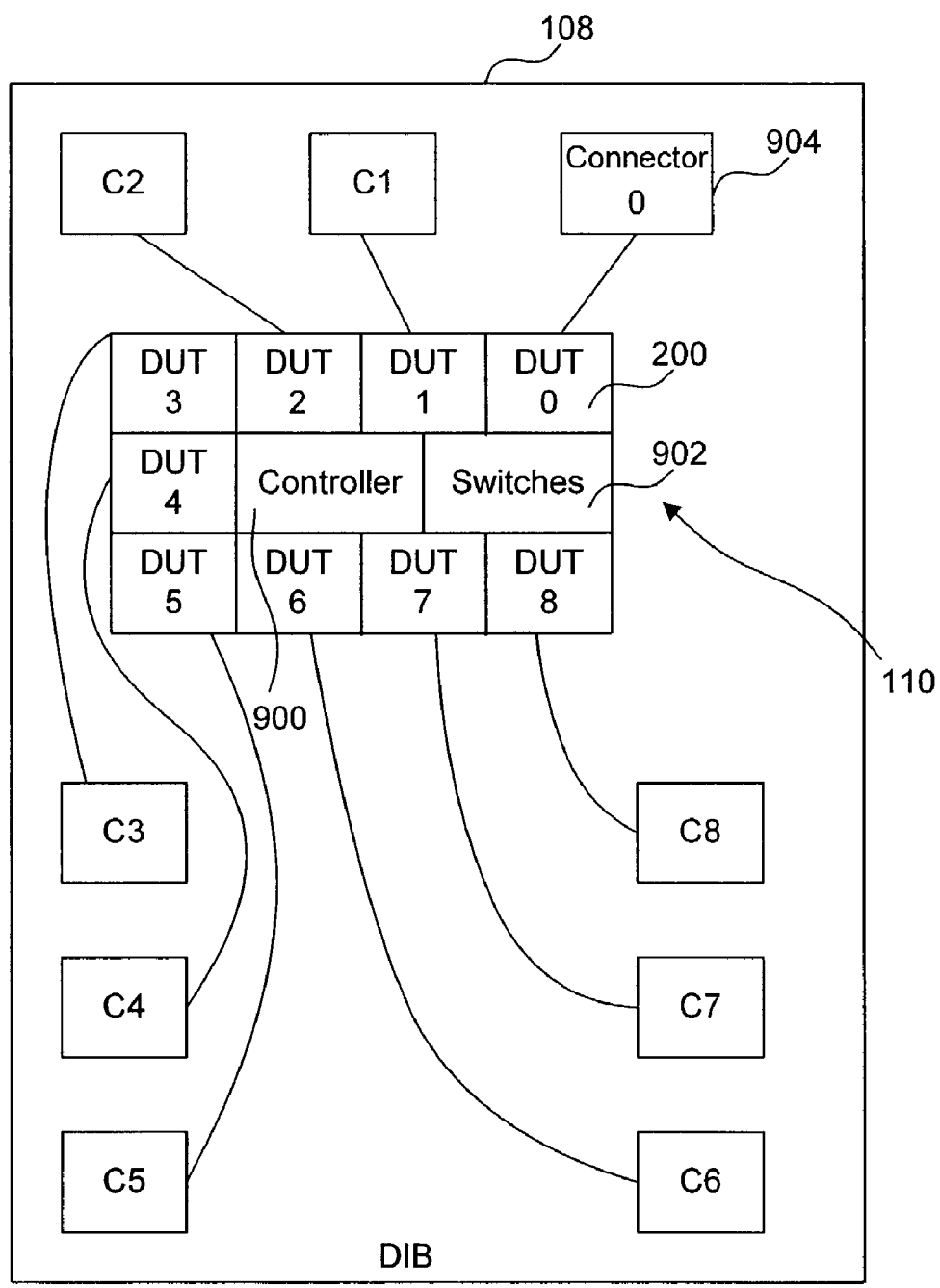
FIG. 9 shows a more detailed view of elements on a device interface board in the system in the preceding figures.

FIG. 9 shows an arrangement of components on the DIB 108 according to embodiments of the present invention. The DUT holding device 110 includes nine cores 200 (labeled DUT-0 through DUT-8), a controller 900, and a switching system 902. Each of the cores 200 is coupled to a corresponding connector 904 (labeled C-0 through C-8). For example, nodes 212 and 214 of each core 200 are connected to a corresponding connector C0-C8. As can be seen in FIGS. 8 and 9, the C/Ms 804 are located in the same position on rider board 112 as the connectors (Cs) 904 on the DIB 108. C/Ms 804 and Cs 904 are connected via connectors 602 (FIG. 6).

Figure 10:
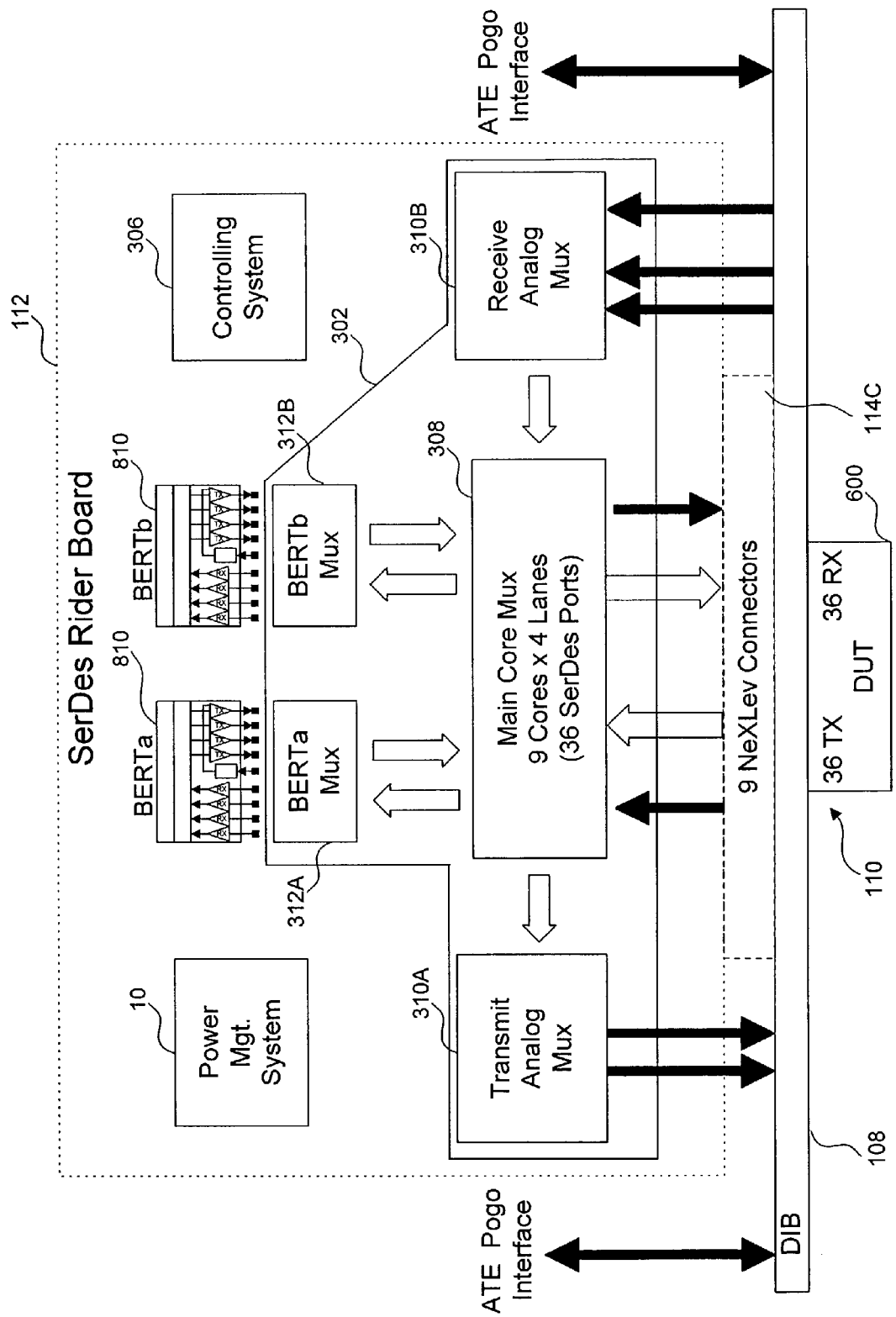
FIG. 10 shows a more detailed view of elements on a rider board in the system in the preceding figures.

FIG. 10 is a block diagram showing more details of the elements on the rider board 112 and the DIB 108 according to embodiments of the present invention. The multiplexing system 302 on the rider board 112 is coupled to the nine cores 200 via the connecting device 602 that connects the Cs 904 on the DIB 108 to the C/Ms 200 on the rider board 112. Signal paths associated with each of the nine cores 200 in the DUT 600 are coupled (e.g., electrically) to each other and to the external testing system 102 in various signal paths based on signal paths provided through a main core multiplexer 308 to perform during various testing operations as described in more detail below.

For example, during analog testing operations, as described in more detail below with reference to FIG. 23, the cores 200 in the DUT 600 are coupled to an analog transmit testing system 116A in the analog testing system 116 via the transmit analog multiplexer 310A and/or to an analog receive testing system 116B in the analog testing system 116 via the receive analog multiplexer 310B. In another example, during BERT testing operations, as described in more detail below with respect to FIG. 22A, the cores 200 in the DUT 600 are coupled to one of two BERT engines 1010A and 1010B via BERT multiplexers 312A and 312B located in the multiplexing system 302. Input and output (I/O) nodes in the analog testing multiplexers 310 and the BERT multiplexers 312 are controlled via the multiplexer controller 306 to form signal paths through the multiplexers 308, 310, and 312 and to take signals off-board. All of the components on the rider board 112 are powered via a power management system 1014.

Figure 11:
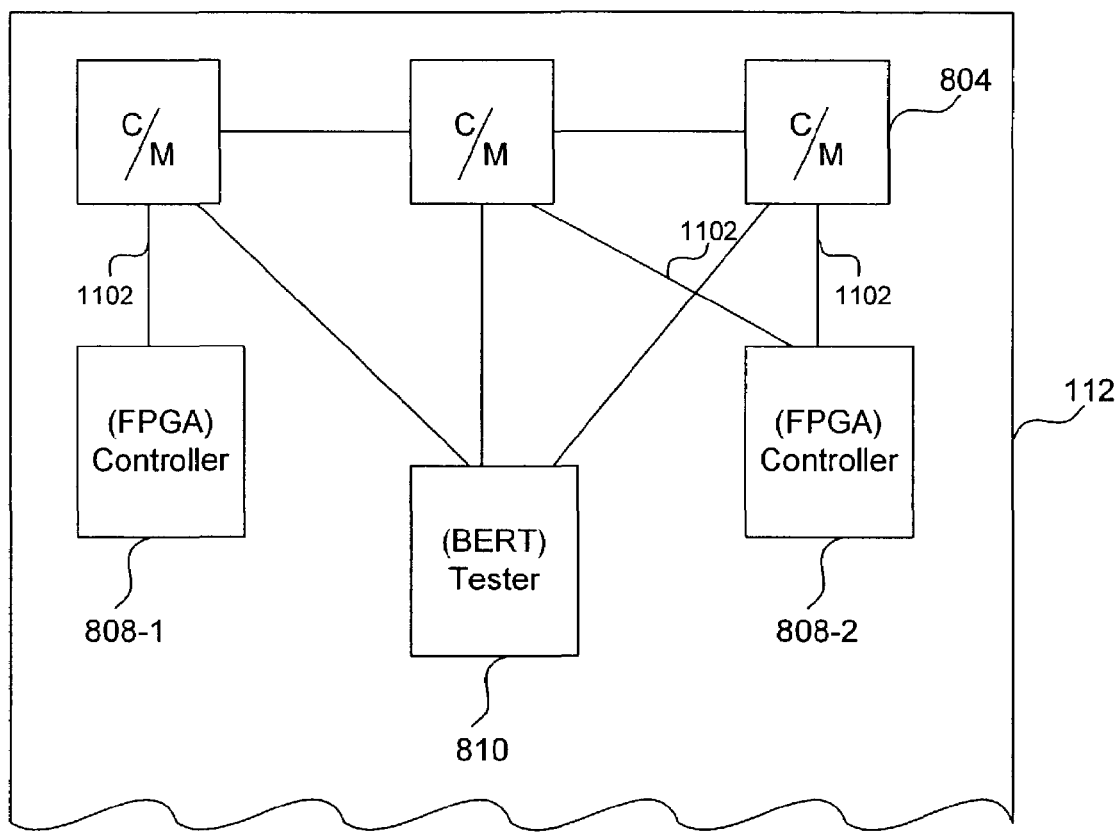
FIG. 11 shows exemplary connections between elements on a rider board in the system in the preceding figures.

FIG. 11 shows a portion of connections made between elements on the rider board 112 according to embodiments of the present invention. A first set of C/Ms 804 (e.g., all but two C/Ms) can be coupled to controller 808-1 via control lines 1102 and a second set of C/Ms 804 (e.g., the remaining ones not coupled to 808-1) and all other multiplexers (e.g., multiplexers 310 and 312) on rider board 112 can be coupled to 808-2 via control lines 1102. As will be discussed in more detail below, there are 16 multiplexers 1202 (FIG. 12) connected to each controller 808, where each multiplexer 1202 receives 6 control lines that carry control signals from the controller 808 to the C/M 804. Thus, each line 1102 entering a C/M 804 in FIG. 11 equates to 8×6=48 control lines. Hence, there are at least 48×9=432 total control lines between the controllers 808 and the C/Ms 804 to control the routing of signals 210 and 216 between the devices 200, the internal testing system 304, and the external testing system 102. Also, there are other control lines 1102 to the other multiplexers (e.g., 310 and 312) that are controlled by controllers 808. In total, there can be over 800 control lines 1102. The controlling forms signal paths through the system 100, and more specifically through the connecting devices (now shown) on the multiple layers of connecting sections 800. In various embodiments, either one or both of the controllers 808 can be connected to each of the C/Ms 804. Also in various embodiments, each of the C/Ms 804 is coupled to one of the testers 810, which can be through the BERT multiplexer 312 as shown in FIG. 10.

Rider Board Multiplexing/Switching System

Throughout the rest of the specification, the following protocol will be used to describe the system 100 and operations performed by the system 100. TX# and RX#. This is meant to convey: T=transmitter and R=receiver; X=core number, and #=port number of the identified core. For example T00 is a transmitter in port 0 of core 0 and R21 is a receiver in port 1 of core 2. If only X is used, then no particular core is being discussed, just the cores in general.

Figure 12:
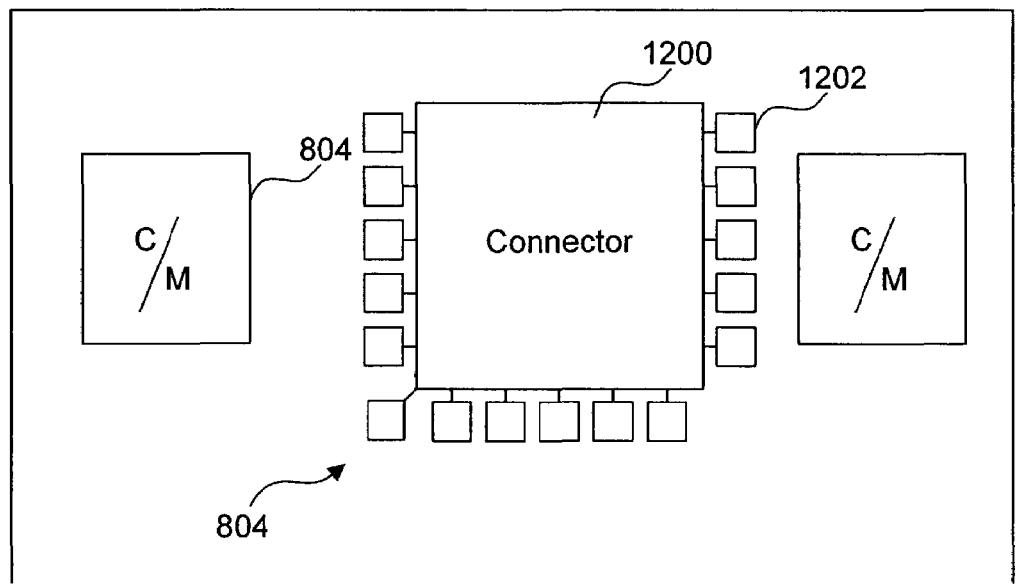
FIG. 12 shows a more detailed view of a connection and multiplexing system on a rider board in the system in the preceding figures.
Figure 13:
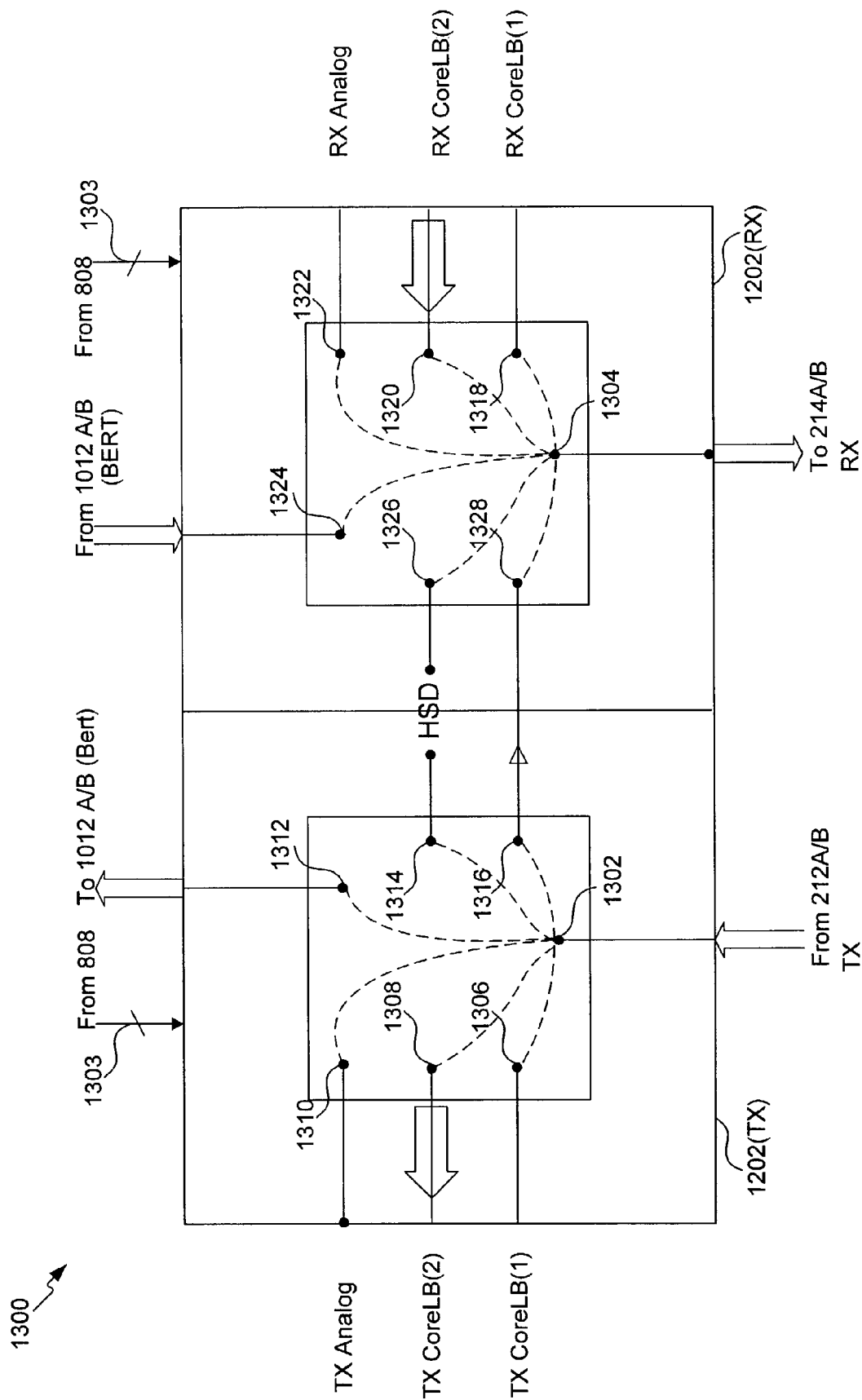
FIG. 13 shows a more detailed view of a section of a multiplexing system on a rider board in the system in the preceding figures.
Figure 14:
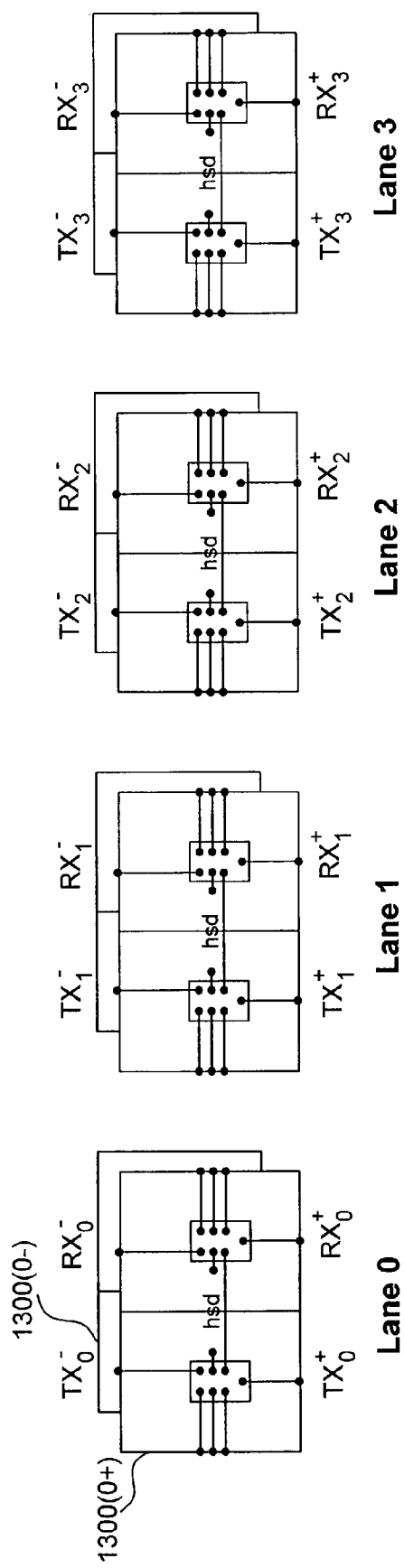
FIG. 14 shows a more detailed view of a section of a multiplexing system on a rider board in the system in the preceding figures.

FIGS. 12–14 show a more detailed view of the C/M 804 according to embodiments of the present invention. Each of the C/Ms 804 include a connector 1200 and switches or multiplexers 1202 that are located in the main core multiplexer 1004. The multiplexers 1202 can be high bandwidth 1:6 multiplexers, i.e., multiplexers capable of passing signals having frequencies in the multi-gigabit per second range with little attenuation. The number of multiplexers 1202 coupled to the connector 1200 is based on the number of pins 212 and 214 associate with each core 200. In the example being used throughout the specification, each core 200 has four ports 220 with four pins 212A–B and 214A–B per port 220 for a total of 16 pins. Thus, the connector 1200 would need to be coupled to 16 multiplexers 1202, one for each pin 212 and 214.

FIG. 13 illustrates a pair 1300 of multiplexers 1202(TX) and 1202(RX) according to embodiments of the present invention. Signal paths through the multiplexers 1202 are shown as dashed lines. If multiplexer 1202(TX) is routing a signal 210 originating from pin 212(TX), the signal 210 is input at node 1302 and can be selectively routed under control of the controller 808 via control line 1303 carrying at least six control signals to one of six nodes: (1) a TX Core Loopback first direction node 1306; (2) a TX Core Loopback second direction node 1308, (3) a TX Analog node 1310; (4) a BERT multiplexer node 1312; (5) a high speed digital (HSD) node 1314 (coupled to the digital testing system 118); or (6) a RX node 1316. Multiplexer 1202(TX) routes a signal from node 1302 to a selected on of nodes 1306–1316 by connecting node 1302 to the selected node.

With continuing reference to FIG. 13, similarly, if multiplexer 1202(RX) is routing a signal 216 going to 214(RX), the signal 216 is output from node 1302 and can be selectively routed under control of the controller 808 via control line 1303 carrying at least six control signals. The signal 216 is input at one of six nodes: (1) a RX Core Loopback first direction node 1318; (2) a RX Core Loopback second direction node 1320; (3) a RX Analog node 1322; (4) a BERT multiplexer node 1324, (5) a HSD node 1326; or (6) a TX node 1328. A more detailed discussion of the signal paths through the pair of multiplexers 1300 during testing operations will be discussed below. It is to be appreciated, multiplexers do not have to be in pairs, but can be by themselves.

FIG. 14 shows one embodiment of an arrangement of the multiplexer pairs 1300. In this figure, the pairs 1300 are arranged corresponding to a device 200 having 4 ports/lanes 220 with differential transmit 212 and receive 214 pins.

Figure 15:
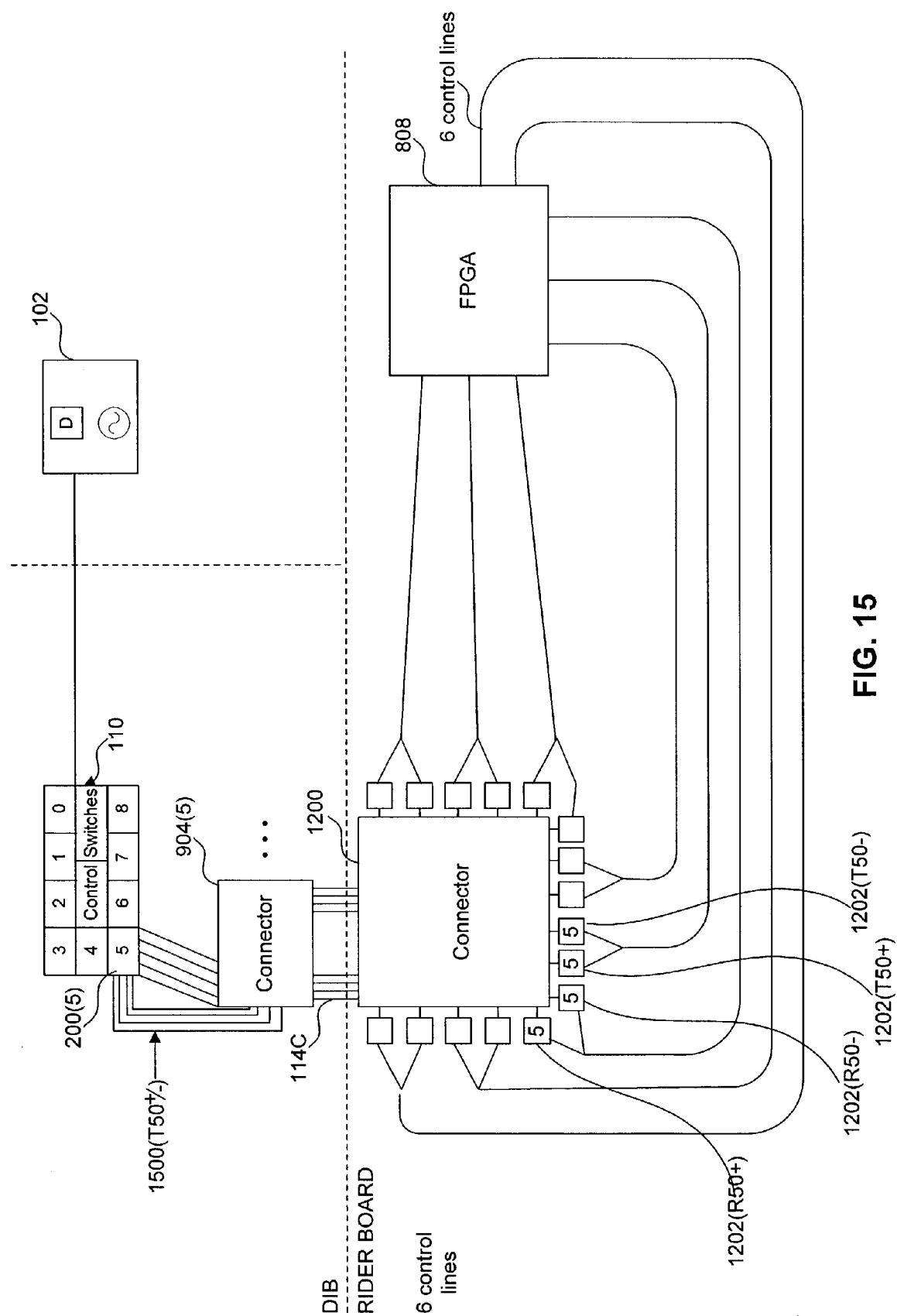

FIG. 15 shows connections between components in a portion of the system 100 according to embodiments of the present invention. Thus, if core 200(5) on DIB 108 is designated to transmit a signal 210, the signal 210 leaving from the core 200(5) along the channels 222(T50) travels to a corresponding DIB connector 904(C5), through connector 602(5), to corresponding rider board connector 1200(C5), to the node 1302 on multiplexer 1202(T50). Then, the controller 808 sends a control signal to the multiplexer 1202(T50) to select the node (e.g., 1306–1316) through which the signal 210 will be routed. In a similar fashion, when the core 200(5) is designated to receive signal 216, signal 216 will enter the multiplexer 1202(R50) from one of the nodes (e.g. 1318–1328) and be routed under control of the controller 808 out node 1304. The signal 216 then travels through the connectors 1200(C5), 602(5), and 904(C5) to the pin 214A (R50) or 214B(R50) of core 200(5).

Figure 16A:
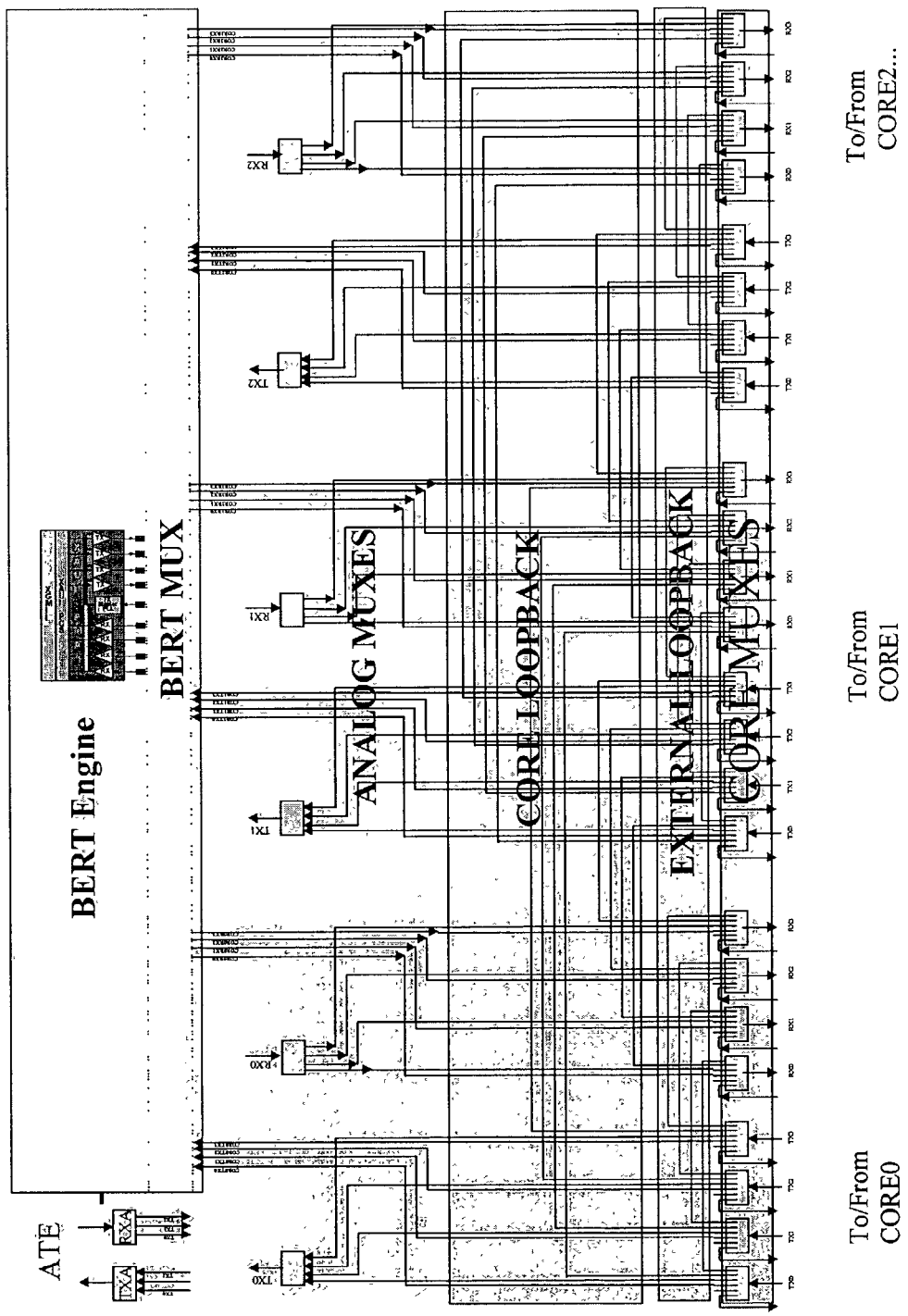
FIGS. 16A–16B show exemplary connections between elements on a rider board in the system in the preceding figures.
Figure 16B:
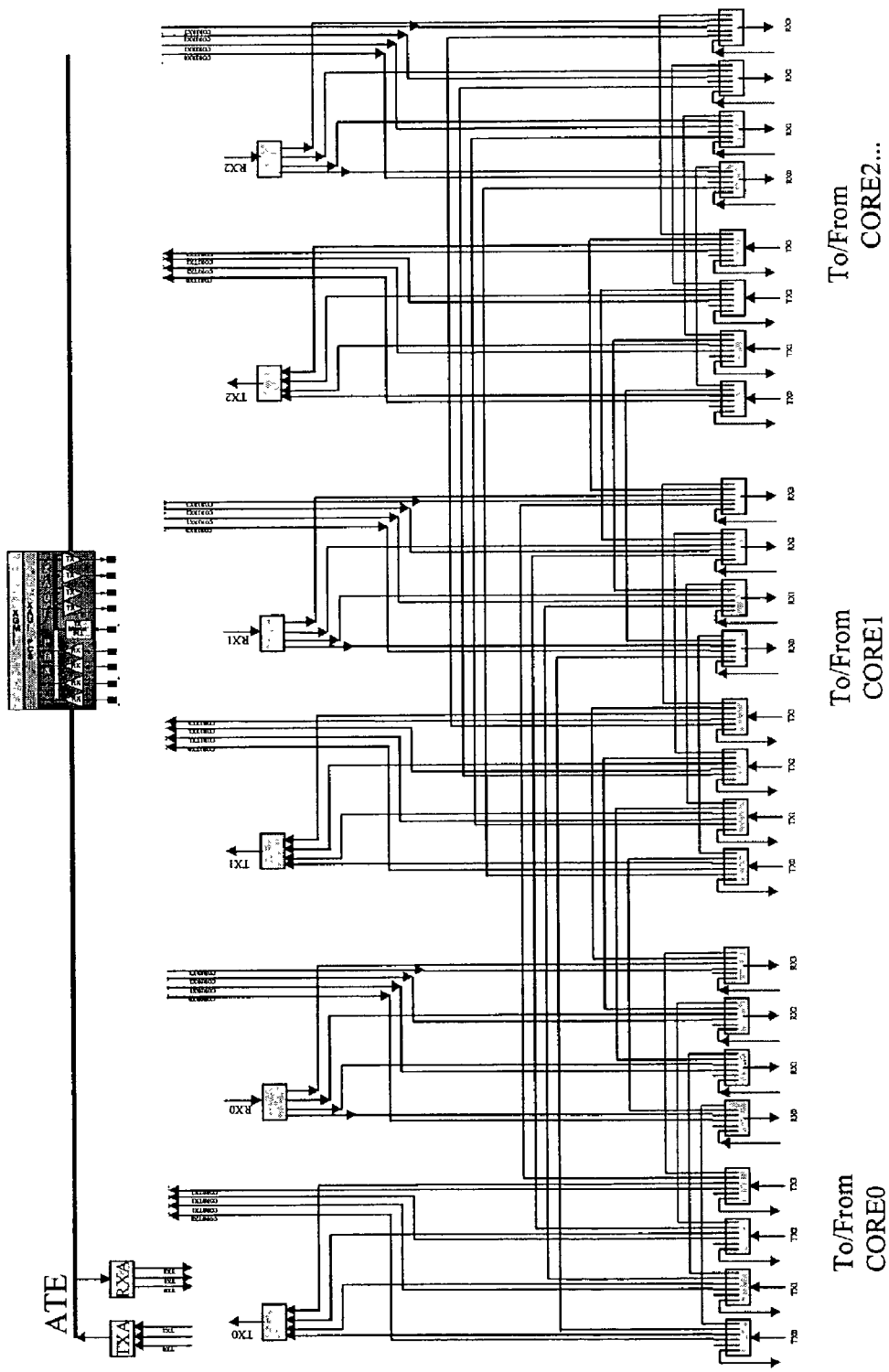

FIGS. 16A–16B, which are unlabeled for convenience, are schematic diagrams showing the connections on the rider board between multiplexers 1202, 1004, 1006, and 312 for cores 200(0)–200(2). This figure only shows the TX+ and RX+ multiplexers 1202 corresponding to TX+ and RX+ pins 212A and 212B and 214A and 214B of the cores 200(0) –200(2). As will be described in more detail below regarding the operation of system 100, various automated testing operations are performed on the cores 200 based on the connections and signal paths formed between the multiplexers 1202, 1006/1008, and 1012.

The rider board 112 accomplishes routing of serial data signals having Gbps baud rates in some embodiments with high bandwidth switches 1202 (e.g., GaAs switches) implemented as various stages of multiplexers in the multiplexing system 302. This arrangement allows for complete (e.g., end-to-end) routing of serial data signals from the DUT 600 to all necessary resources. The routing allows for many instances of parallel testing operations (e.g., simultaneous core loop back, snaking, BERT, etc.), as well as the ability to route any DUT serial data signal to an external testing system 102 resource.

Radio frequency (RF) cables from the external testing system 102, which are for carrying signals, are directly coupled to the rider board 112. Full connectivity allows for at least the following testing operations: differential signal connectivity to BERT/PRBS engines 1010, differential signal connectivity to analog instruments 116, differential connectivity to external testing system devices 102, self core loopback, adjacent core loopback, and snaking configurations.

The ability to perform simultaneous or parallel testing of multiple cores 200, which can be integrated and/or fabricated on one semiconductor, greatly reduces test time and the cost of testing. Also, because the rider board 112 provides high bandwidth signal paths to the analog testing system 116, as the external testing system 102 gradually introduces higher and higher bandwidth instrumentation, the DUT 600 can immediately make use of the external testing system improvements via the rider board 112.

As discussed above, in some embodiments of the rider board 112 the internal testing system 304 can include one or more SerDes chips or other silicon technology manufactured by Broadcom Corporation as the source for at-speed digital functional testing and BERT testing. These embodiments can make use of Broadcom's design-for-test (DFT) approach to manufacturing chips that have integrated BERT and PRBS generators complete with on-chip memory and programmable transmit amplitudes. Therefore, by using Broadcom semiconductors in these embodiments, the need for focused external testing system instruments or BERT/PRBS bench instrumentation is substantially reduced. Also, the rider board 112 allows for rapid upgrades with silicon speed improvements with a simple board re-design for new semiconductor device(s). In the embodiments using Broadcom semiconductors on the rider board 112, the semiconductors can be programmed via industry standard Managed Data Interface (MDI—IEEE 802.3 clause 22 and 45), which allows rapid programming to alleviate the need for slow external general purpose interface bus (GPIB) interface to BERT/PRBS bench instrumentation.

Automated At-Speed Self Testing Operations

Throughout the rest of the figures, external arrows between cores 200 or between ports 220 of a core 200 represent a signal path traversing the multiplexer system 302 on the rider board 112 or established through the multiplexer system 302 on the rider board 112. This routing is illustrated in detail in FIGS. 18B, 19B, 22, and 23. Arrows shown inside the cores 200 represent internal looping either within the core 200 or through the DUT socket circuitry. In FIGS. 17A–17C, 18A–18B, 22A–22B, and 23B, signals that appear to be generated from a core 200 can be generated by a signal source (e.g., a BERT engine) in that core 200. Other signals can be generated, as shown, from sources outside cores 200. Although not shown, a device and/or apparatus can be coupled to the individual cores 200 or to tested system 104 to gather the data accumulated during the testing to evaluate the performance of the DUTs 110.

FIGS. 17A–17C, 18A–18B, and 19A–19B illustrate automated self testing operations in the system 100 according to embodiments of the present invention. Throughout the description of the operations of system 100 it is to be appreciated that, although not always described, every signal can be a serial data signal 210 and can be routed through signal paths formed through the multiplexers 1202 based on control signals from the controller 808. The control signal determines which output node on the multiplexer 1202 an input signal 210 is output. It is to be appreciated that almost all the automated testing operations involve full duplex serial data signal transmission. That means that all the pins 212 and 214 are transmitting and receiving serial data signals 210 and 216 at the same time. Thus, in our example of having nine cores 200 with four ports 220 per core 200 and four channels 222 (or four pins 212 and 214) per port 220, 144 serial data signals 210 and 216 are routed by a core 200 to an adjacent core 200 at the same time.

FIG. 17A shows an automated self loopback method 1700 according to embodiments of the present invention. During this operation 1700, serial data signals 210 generated in the core 200 are routed through the multiplexers 1202 corresponding to that core 200 and back to that core 200. For example, serial data signals 210 transmitted from the core 200(X) are received at node 1302 of the corresponding transmit multiplexer 1202(TX) and routed to and output from node 1316. The serial data signals 210/216 are then received at node 1328 of the receive multiplexer 1202(RX) and routed to and output from node 1304. The serial data signals 216 then travel back to the same core 200(X). Similarly, all the other cores 200(1–8) and their corresponding multiplexer can be routing serial data signals.

FIG. 17B shows an automated full duplex adjacent core loopback method 1710 in a first "direction," where a direction can be a grouping of adjacent cores 200. The first direction configures cores 200 as follows: 0–1, 2–3, 4–5, and 6–7, where core 8 is not involved. During this operation, serial data signals 210 output from all the pins 212A–B in a first core 200 are routed through the multiplexers 1202 to a second, adjacent core 200, while serial data signals 210 output from all the pins 212A–B in the second core 200 are sent from the second core 200 and routed through the multiplexers 1202 to the first core 200. For example, serial data signals 210 generated from core 200(0) are received at nodes 1302 on corresponding transmit multiplexer 1202(T0) and routed to and output from nodes 1306. The signals 210/216 are then received at nodes 1318 in the multiplexers 1202(R1) and routed to and output from nodes 1304 to core 200(1). Also, core 200(1) simultaneously sends serial data signals 210 to core 200(0) based on the same functionality of the system 100. Further, all the other core pairs, 2–3, 4–5, and 6–7, can be simultaneously routing serial data signals 210/216 between each other through their corresponding multiplexers.

FIG. 17C shows an automated full duplex adjacent core loopback method 1720 in a second direction. The second direction configures cores 200 as follows: 1–2, 3–4, 5–6, and 7–8, where core 0 is not involved. During this operation, serial data signals 210 output from all the pins 212A–B in a first core 200 are routed through the multiplexers 1202 to a second, adjacent core 200, while serial data signals 210 output from all the pins 212A–B in the second, adjacent core 200 are sent from the second core 200 and routed through the multiplexers 1202 to the first core 200. For example, serial data signals 210 generated from core 200(1) received at nodes 1302 on corresponding transmit multiplexer 1202 (T1) and routed to and output from the nodes 1308. The signals 210/126 are then received at nodes 1320 in the multiplexers 1202(R2) and routed to and output from nodes 1304 to core 200(2). Also, core 200(2) simultaneously sends serial data signals to core 200(1) based on the same functionality of the system 100. Further, all the other pairs, 3–4, 5–6, and 7–8, are simultaneously sending serial data signals 210/126 between each other.

FIGS. 18A–B pictorially show an automated internal snake down testing operation 1800 according to embodiments of the present invention. During this operation 1800 signals generated in core 200(0) are sequentially routed through all the cores 200 until they reach core 200(8). In order to perform this operation 1800, both the adjacent core loopback operations 1710 and 1720 are performed in alternating fashion. For example, operation 1710 is performed to send signals from core 200(0) to core 200(1), then operation 1720 is performed to send signals from core 200(1) to core 200(2), then operation 1710 is performed to send signals from core 200(2) to core 200(3), and so on.

With continuing reference to FIG. 18B, the signal path for the operation 1800 is shown. Only the first three stages are shown for convenience. During a first stage, a signal generated in core 200(0) is transmitted from pin 212A(T00) to connector 904(C0), to connector 1200(C0), to node 1302 (T00), to node 1306(T00), to node 1318(R10), to node 1304(R1), to connector 1200(C1), to connector 904(C1), and to pin 214A(R10) in core 200(1). During a second stage, the signal is passed through the core 200(1) to be transmitted from pin 212A(T10), to connector 904(C1), to connector 1200(C1), to node 1302(T10), to node 1308(T10), to node 1320(R20), to node 1304 (R20), to connector 1200(C2), to connector 904(C2), and to pin 214A(R20) in core 200(2). During a third stage, the signal is passed through the core 200(2) to be transmitted from pin 212A(T20), to connector 904(C2), to connector 1200(C2), to node 1302(T20), to node 1306(T20), to node 1318(R30), and so on. The subsequent stages follow a similar pattern for the signal path.

FIGS. 19A–B pictorially show an automated internal snake-up testing operation 1900 according to embodiments of the present invention. During this operation 1900 signals generated in core 200(8) are routed in reverse sequence through all the cores 200 until they reach core 200(0). In order to perform this operation 1900, both the adjacent core loopback operations 1710 and 1720 are performed in alternating fashion. For example, operation 1720 is performed to send signals from core 200(8) to core 200(7), then operation 1710 is performed to send signals from core 200(7) to core 200(6), then operation 1720 is performed to send signals from core 200(6) to core 200(5), and so on.

With continuing reference to FIG. 19B, the signal path for the operation 1900 is shown. Only the first three stages are shown for convenience. During a first stage, a signal generated in core 200(8) is transmitted from pin 212A(T80) to connector 904(C8), to connector 1200(C8), to node 1302 (T80), to node 1308(T80), to node 1320(R70) to node 1304(R70), to connector 1200(C7), to connector 904(C7), and to pin 214A(R70) of core 200(7). During a second stage, the signal is passed through the core 200(7) to be transmitted from pin 212A(T70) to connector 904(C7), to connector 1200(C7), to node 1302(T70), to node 1306(T70), to node 1318(R60), to node 1304 (R60), to connector 1200(C6), to connector 904(C6), and to pin 214A(R60) in core 200(6). During a third stage, the signal is passed through the core 200(6) to be transmitted from pin 212A(T60) to connector 904(C6), to connector 1200(C6), to node 1302(T60), to node 1308(T60), to node 1320(R50), and so on.

Thus, as can be seen through the description to FIGS. 17A–19B, the operations are based on a certain protocol. That protocol can be summarized as follows: (1) determine what core 200 a signal (e.g., a first signal) will be transmitted from; (2) determine which core 200 a signal (e.g., a second signal) will be transmitted to; (3) determine which pin the signal will be transmitted from; and (4) generate at least one control signal in the controller 808 that is transmitted to the multiplexers 1202 associated with the cores 200 and pins 212 and 214 based on the determinations. This protocol follows through for almost all automated testing operations discussed above and below.

Automated At-Speed External System Testing Operations

In FIGS. 20–22B, automated full duplex at-speed (e.g., multiple gigabit per second baud rate) functional system testing methods and operations are shown. These tests can involve using a test signal from the internal 304 testing systems in the signal path. Thus, test signals may not be generated from a core under test as was done in the automated self testing operations described above. However, the general protocol still applies, as do the signal paths as described above. Thus, a main difference between the self testing and functional testing operations is that signals will be input from, output to, or routed through internal 304 testing system instead of directly between multiplexers 1202. Therefore, for convenience of discussion, only additional steps or signal paths will be discussed and previous signal paths will be referenced. Full duplex testing allows for testing using different frequencies (e.g., a core clock and a BERT engine clock), so there will be asynchronous frequency offset between a near end and far end of the system.

FIG. 20 pictorially shows an exemplary automated external snake down testing operation 2000, which is similar to the automated internal snake down testing operation 1800. A main difference between operation 2000 and operation 1800 is that instead of core 200(0) generating a test signal, core 200(0) receives a test signal 2002 from the external tester 304. After receiving the test signal at core 200(0), the system utilizing rider board 112 routes the signal sequentially in an ascending core order to the other cores 200 using the signal path as described above with reference to FIGS. 18A–18B and the internal snake down operation 1800. After passing through core 200(8), the signal is sent back to the internal testing system 304.

FIG. 21 pictorially shows an exemplary automated external snake up testing operation 2100, which is similar to the automated internal snake up testing operation 1900. A main difference between operation 2100 and operation 1900 is that instead of core 200(8) generating a test signal, core 200(8) receives a test signal 2102 from the internal testing system 304. After receiving the test signal at core 200(8), the system 100 utilizing rider board 112 routes the signal sequentially in a descending core order to the other cores 200 using the signal path as described above with reference to FIGS. 19A–19B and the internal snake down operation 1900. After passing through core 200(8), the signal is sent back to the internal testing system 304.

FIG. 22A pictorially shows an exemplary automated BERT testing operation 2200 according to embodiments of the present invention. This testing operation 2200 is most similar to the self loopback method 1700 shown in FIG. 17A. One different is that two signals are flowing through the system, one from a BERT engine in a core 200 and one from BERT engines on rider board 112, are utilized. Another difference is that the signal received from a core 200 at node 1302 of the pair of multiplexers 1300 is routed to and output from node 1312 to the BERT engine 1010A/B via the BERT multiplexer 1012A/B. After passing through the BERT engine 1010A/B, the signal is received at node 1324 and routed to and output through node 1304 back to the same core 200 from which it was transmitted. Thus, the signal interacts with the internal testing system 304 before being routed back to its initial core 200.

As seen in FIG. 22A, four cores 200(0–3) are coupled to the first BERT engine 1010A through the first BERT multiplexer 1012A and five cores 200(4–8) are coupled to the second BERT engine 1010B through the second BERT multiplexer 1012B. In alternative configurations, more or less BERT multiplexers 312 can be used, thus changing the number of cores 200 coupled to a single the BERT engine 1010.

Automated Analog Testing Methods

FIG. 23A pictorially illustrates an automated analog transmit testing operation 2300 according to embodiments of the present invention. A signal generated by a core 200 is received at node 1302 of the pair of multiplexers 1300 and routed to and output from node 1310 to analog transmit multiplexers 310 and then to an analog transmit testing system 116A in external testing system 102. As shown, cores 200(0)–200(3) use analog system multiplexer 310A-1 and cores 200(4)–200(8) use analog system multiplexer 310A-2. It is to be appreciated, the cores can be grouped in any manner, so long as the multiplexer 310A receiving the signal from four of cores 200 is a 16:1 multiplexer and the multiplexer 310A receiving the signal from five of cores 200 is a 20:1 multiplexer. Once received, the signals are processed in analog transmit testing system 116A by a digital processing device (e.g., a GigaDig device) and evaluated.

During an automated analog transmit testing operation, the transmit multiplexers 1202A are controlled by controller 808 to route signals received at node 1302 to node 1310 and then to the analog transmit multiplexers 310A. In turn, the analog transmit multiplexers 310A are controlled by controller 808 to route signals to the analog transmit signal testing system 116A.

FIG. 23B pictorially illustrates an automated analog receive testing operation 2350 according to embodiments of the present invention. During automated analog receive testing operation 2350 signals are generated in analog testing system 116 and transmitted to core 200 via signal paths established on rider board 112 by controllers 808. There are several embodiments of signal generation. A first embodiment includes signal generators 116B-1 (e.g., ATE source1, ports 1 and 2) that route signals through analog receive multiplexers 310B-1 and 310B-2 and through C/Ms 804 to be received at cores 200. A second embodiment includes signal generators 116B-2 (e.g., ATE source2, ports 1 and 2) that route signals through analog receive multiplexers 310B-1 and 310B-2 and through C/Ms 804 to be received at cores 200. A third embodiment includes signal generator 116B-3 (e.g., ATE source3, ports 1 and 2) that routes signals through analog receive multiplexer 310B-3 to analog receive multiplexers 310B-1 and 310B-2 and through C/Ms 804 from node 1322 out node 1304 to be received at cores 200. Signal generators 116B can be sine wave generators. In other embodiments, two or three of the signal generators 116B can be used to simultaneously or sequentially route different types of signals (e.g., sine waves and jitter modulation) through the rider board 112 to the cores 200.

During an automated analog receive testing operation, the analog receive signal testing system 116B generates a signal that is passed to the analog receive multiplexers 1008, which are controlled by controller 808 to route the signal to node 1322 of the receive multiplexers 1202. The receive multiplexers 1202 are controlled by controller 808 to route the signal to node 1304 from which it is output the core 200 it came from.

Overall Methodology

FIG. 24 illustrates a flow chart depicting a method 2400 for performing automated at-speed testing of devices (e.g., 200) according to embodiments of the present invention. At step 2402 multiplexer control signals are generated. At step 2404, various signal paths are formed between a set of multiplexers and the devices based on the multiplexer control signals. At step 2406, test signals having multiple gigabit per second (MGBPS) baud rates are routed through the signal paths.

FIG. 25 illustrates a flowchart depicting a method 2500 occurring during the generating multiplexer control signals step 2402. At step 2502, first signals are generated indicating where the test signals are being transmitted from. At step 2504, second signals are generated indicating where the test signals are being transmitted to. At step 2506, the multiplexer control signals are generated from the first and second signals.

FIG. 26 illustrates a flowchart depicting a method for performing automated at-speed testing of a device. At step 2602, a set of multiplexers that includes one multiplexer for each of pin on the device is coupled to a rider board. At step 2604, each pin of each multiplexer in the set of multiplexers is individually controlled. At step 2606, signal paths are formed through each of the multiplexers based on the individually controlling step 2604.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A rider board coupled to a device interface board (DIB) in a testing system, the testing system being configured to perform automated at-speed testing of devices under test that are configured to generate serial data signals having multiple gigabit per second baud rates, the rider board comprising:

a coupling section coupling the rider board to the devices under test;

a multiplexing section coupled to said coupling section, the multiplexing section being configured to route testing signals generated by one of the devices under test, as well as testing signals generated by the testing system, back to an originating one of the devices under test, as well as to an adjacent one of the devices under test; and a control section coupled to said multiplexing section that controls routing of said testing signals through said multiplexing section.

2. The rider board of claim 1, wherein said coupling section comprises a rider board connector that is coupled to a corresponding DIB connector on the DIB and wherein said DIB connector is coupled to the devices under test.

3. The rider board of claim 2, wherein said multiplexing section comprises a set of multiplexers coupled to said rider board connector.

4. The rider board of claim 1, wherein said coupling section comprises rider board connectors that are coupled to corresponding DIB connectors on said DIB and wherein said DIB connectors are coupled to the devices under test.

5. The rider board of claim 4, wherein said multiplexing section comprises sets of multiplexers and wherein each of said rider board connectors is coupled to a corresponding one of said sets of multiplexers.

6. The rider board of claim 5, wherein each multiplexer in said set of multiplexers has one input node and six output nodes and wherein each of said nodes on said multiplexer is individually controlled by said controlling section to route a signal through said multiplexer.

7. The rider board of claim 6, wherein said six output nodes comprise at least an analog signal node, a self loopback node, a digital signal node, and a core loopback node for coupling to an adjacent one of said multiplexers.

8. The rider board of claim 5, wherein each multiplexer in said sets of multiplexers is a 1:6 gallium arsenide (GaAs) switch.

9. The rider board of claim 5, further comprising a plurality of layers of connection sections utilized to hold connection devices running between said sets of multiplexers, said control section, and the devices under test.

10. The rider board of claim 5, wherein said sets of multiplexers comprise one multiplexer for every serial pin on a corresponding one of the devices under test.

11. The rider board of claim 1, further comprising a testing section.

12. The rider board of claim 11, wherein said testing section comprises a bit error rate tester (BERT).

13. The rider board of claim 11, wherein said multiplexing section comprises a testing section multiplexer coupled to said testing section.

14. The rider board of claim 1, wherein said multiplexing section comprises analog multiplexers coupled to an analog testing system.

15. The rider board of claim 1, wherein said controlling section comprises a field programmable gate array.

* * * * *